(12) United States Patent
Ko et al.

(10) Patent No.: US 12,733,160 B2
(45) Date of Patent: Sep. 8, 2026

(54) SEMICONDUCTOR DEVICE

(71) Applicant: SAMSUNG ELECTRONICS CO., LTD., Suwon-si (KR)

(72) Inventors: Sanggyu Ko, Suwon-si (KR); Hyuckchai Jung, Suwon-si (KR); Sang-Il Han, Suwon-si (KR); Jungjin Park, Suwon-si (KR); Suhyun Kim, Suwon-si (KR); Chul Lee, Suwon-si (KR); Sungho Jang, Suwon-si (KR); Hyeongwon Jang, Suwon-si (KR); Ilgweon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 271 days.

(21) Appl. No.: 18/456,655

(22) Filed: Aug. 28, 2023

(65) Prior Publication Data

US 2024/0251549 A1 Jul. 25, 2024

(30) Foreign Application Priority Data

Jan. 25, 2023 (KR) ........................ 10-2023-0009750

(51) Int. Cl.
*H01L 29/76* (2006.01)
*H01L 29/94* (2006.01)
*H10B 12/00* (2023.01)

(52) U.S. Cl.
CPC ........... *H10B 12/50* (2023.02); *H10B 12/315* (2023.02); *H10B 12/482* (2023.02); *H10B 12/485* (2023.02); *H10B 12/488* (2023.02)

(58) Field of Classification Search
CPC .... H10B 12/50; H10B 12/315; H10B 12/482; H10B 12/485; H10B 12/488; H10B 12/01; H10B 12/30; H10B 12/31; H10D 64/671; H10D 64/681
USPC ........................................................ 257/295
See application file for complete search history.

(56) References Cited

U.S. PATENT DOCUMENTS 6,716,689 B2 4/2004 Bae et al.
7,402,875 B2 7/2008 Datta et al.
8,617,956 B2 12/2013 Doris et al.
9,064,723 B2 6/2015 Won et al.
10,332,890 B2 6/2019 Lee et al.
(Continued)

FOREIGN PATENT DOCUMENTS

KR 10-1024251 3/2011
KR 10-2022-0085117 A 6/2022

*Primary Examiner* — Theresa T Doan
(74) *Attorney, Agent, or Firm* — Morgan, Lewis & Bockius LLP

(57) ABSTRACT

A semiconductor device includes a substrate including a peripheral active pattern defined by a device isolation layer, a gate structure on the peripheral active pattern, and a gate spacer covering at least a portion of a side surface of the gate structure. The gate structure includes an insulating pattern structure and a metal pattern structure on the insulating pattern structure. The insulating pattern structure includes a recess having a maximum depth in a first direction parallel to a top surface of the substrate at a first height. The insulating pattern structure includes a first gate insulating pattern and a high-k dielectric layer, which are sequentially stacked on the top surface of the substrate. The gate spacer includes a protrusion inserted in the recess.

20 Claims, 16 Drawing Sheets

(56) References Cited

U.S. PATENT DOCUMENTS

| | | | | |
|---|---|---|---|---|
| 10,541,302 | B2 | 1/2020 | Yoon et al. | |
| 2022/0173112 | A1 | 6/2022 | Kim et al. | |
| 2022/0190132 | A1 * | 6/2022 | Back | H10B 12/09 |

* cited by examiner

420
CP
PP
CPLG
342
370
100x
120
100
100y
A'
110a
PTR
HT1
ED
P
RS1
410
SP1 SP2 SP3
PACT
PR
W1
W2
A
GSP
330
331
310
CP2
CP1
HK
GI2
GI1
MPS
IPS
GS
D1
D2
D3

100x
120
100
100y
A'
110a
PTR
HT1
ED
RS1
PACT
PR
GSP
330
331
310
CP2
CP1
HK
GI2
GI1
110a
A
D1
D2
D3

420
CP
CPLG
PP
342
370
100x
120
100
100y
A'
110a
PTR
HT2
ED
RS2
410
SP1 SP2 SP3
PACT
PR
GSP
330
331
310
CP2
CP1
HK
GI2
GI1
GS
A
D1
D2
D3

420
CP
CPLG
PP
342
370
100x
120
100
100y
A'
PTR
HT4
ED
RS4
110a
410
SP1 SP2 SP3
PACT
PR
GSP
330
331
310
CP2
CP1
HK
GI2
GI1
GS
A
D1
D2
D3

420
CP
PP
CPLG
342
370
100x
120
100
100y
A'
410
SP1 SP2 SP3
PTR
HT5
RS5
110a
PACT
PR
GSP
330
331
310
CP2
CP1
HK
GI2
GI1
GS
A
D1
D2
D3

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0009750, filed on Jan. 25, 2023, in the Korean Intellectual Property Office, the entire contents of which are hereby incorporated by reference.

BACKGROUND OF THE INVENTION

The present disclosure relates to a semiconductor device, and more particularly, to a semiconductor device including gate structures and a method of manufacturing the same.

Semiconductor devices are widely used in the electronics industry because of their small sizes, multi-functional characteristics, and/or low manufacturing costs. Semiconductor devices may be categorized as semiconductor memory devices for storing logical data, semiconductor logic devices for processing logical data, and hybrid semiconductor devices having both the function of the semiconductor memory devices and the function of the semiconductor logic devices.

As high-speed and/or low-power electronic devices have been demanded, high-speed and/or low-voltage semiconductor devices used therein have also been demanded, and highly integrated semiconductor devices have been required to satisfy these demands. However, as the integration densities of semiconductor devices increase, electrical characteristics and production yields of the semiconductor devices may be deteriorated or reduced. Thus, techniques for improving electrical characteristics and production yields of semiconductor devices have been variously studied.

SUMMARY

Embodiments of the inventive concepts may provide a semiconductor device with improved electrical characteristics and reliability, and a method of manufacturing the same.

In an aspect, a semiconductor device may include a substrate including a peripheral active pattern defined by a device isolation layer, a gate structure on the peripheral active pattern, and a gate spacer covering at least a portion of a side surface of the gate structure. The gate structure may include an insulating pattern structure and a metal pattern structure on the insulating pattern structure. The insulating pattern structure may include a recess having a maximum depth in a first direction parallel to a top surface of the substrate at a first height. The insulating pattern structure may include a first gate insulating pattern and a high-k dielectric layer, which are sequentially stacked on the top surface of the substrate. The gate spacer may include a protrusion inserted in the recess.

In an aspect, a semiconductor device may include a substrate including a peripheral active pattern defined by a device isolation layer, a gate structure on the peripheral active pattern, a gate spacer covering at least a portion of a side surface of the gate structure, a lower insulating pattern provided on the substrate and covering the gate structure and the gate spacer, and a contact plug laterally spaced apart from the gate structure and penetrating the lower insulating pattern so as to be connected to the substrate. The gate structure may include an insulating pattern structure and a metal pattern structure on the insulating pattern structure. The insulating pattern structure may include a recess having a maximum depth in a first direction parallel to a top surface of the substrate at a first height. A distance from a side surface of the contact plug to a side surface of the metal pattern structure may be a first distance, and a distance from the side surface of the contact plug to a bottom surface of the recess may be a second distance. The second distance may be greater than the first distance.

In an aspect, a semiconductor device may include a substrate including cell active patterns on a cell region and a peripheral active pattern on a peripheral region around the cell region, word lines provided in the substrate and intersecting the cell active patterns, bit lines provided on the substrate and intersecting the word lines, a bit line contact provided on a central portion of each of the cell active patterns and connected to a corresponding one of the bit lines, a storage node contact on each of both end portions of each of the cell active patterns, a landing pad on the storage node contact, a capacitor on the landing pad, a gate structure on the peripheral active pattern, and a gate spacer covering at least a portion of a side surface of the gate structure. The gate structure may include an insulating pattern structure and a metal pattern structure on the insulating pattern structure. The insulating pattern structure may include a recess having a maximum depth in a first direction parallel to a top surface of the substrate at a first height. The gate spacer may include a protrusion inserted in the recess.

BRIEF DESCRIPTION OF THE DRAWINGS

FIG. 13 is a cross-sectional view taken along the line A-A' of FIG. 2 to illustrate a semiconductor device according to some embodiments of the inventive concepts.

FIG. 14 is a cross-sectional view taken along the line A-A' of FIG. 2 to illustrate a semiconductor device according to some embodiments of the inventive concepts.

DETAILED DESCRIPTION

Embodiments of the inventive concepts will now be described more fully with reference to the accompanying drawings.

Figure 1:
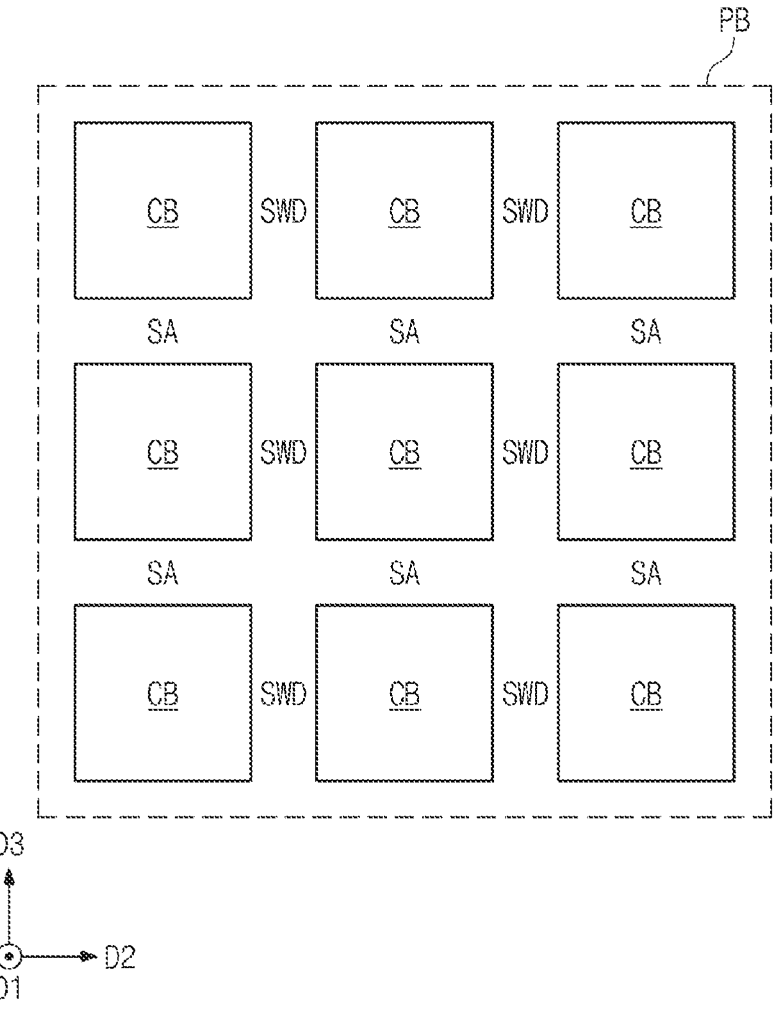
FIG. 1 is a block diagram illustrating a semiconductor device according to some embodiments of the inventive concepts.

FIG. 1 is a block diagram illustrating a semiconductor device according to some embodiments of the inventive concepts.

Referring to FIG. 1, a semiconductor device may include cell blocks CB and a peripheral block PB surrounding the cell blocks CB. The semiconductor device may be a memory device, and each of the cell blocks CB may include a cell circuit such as a memory integrated circuit. The peripheral block PB may include various peripheral circuits involved in operating the cell circuit, where the peripheral circuits may be electrically connected to the cell circuit.

The peripheral block PB may include sense amplifier circuits SA and sub-word line driver circuits SWD. For example, the sense amplifier circuits SA may face each other with the cell block CB interposed therebetween, and the sub-word line driver circuits SWD may face each other with the cell block CB interposed therebetween. The cell blocks CB may be arranged in a 2-dimensional array, where sense amplifier circuits SA may alternate with the cell blocks CB in columns, and the sub-word line driver circuits SWD may alternate with cell blocks CB along rows. The peripheral block PB may further include power and ground driver circuits for driving the sense amplifier, but embodiments of the inventive concepts are not limited thereto.

Figure 2:
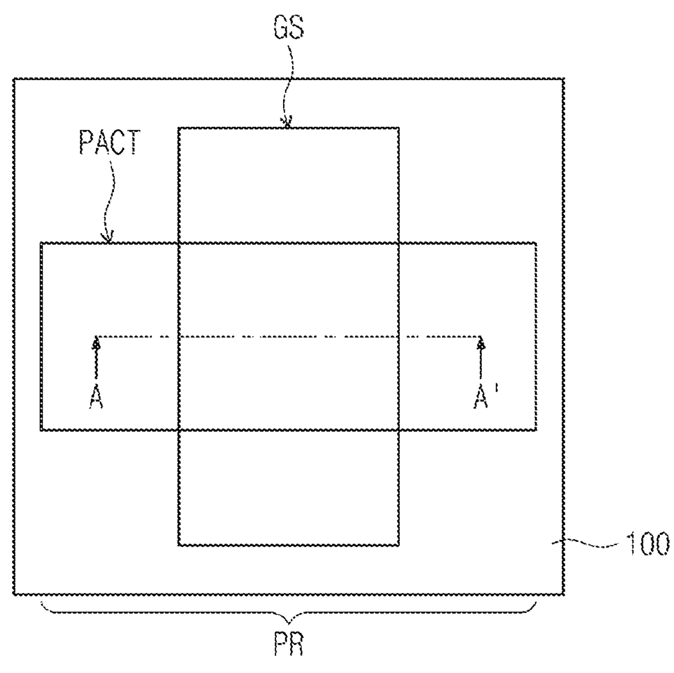
FIG. 2 is a plan view illustrating a semiconductor device according to some embodiments of the inventive concepts.
Figure 2:
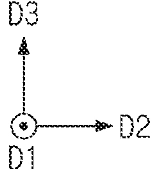
Figure 3:
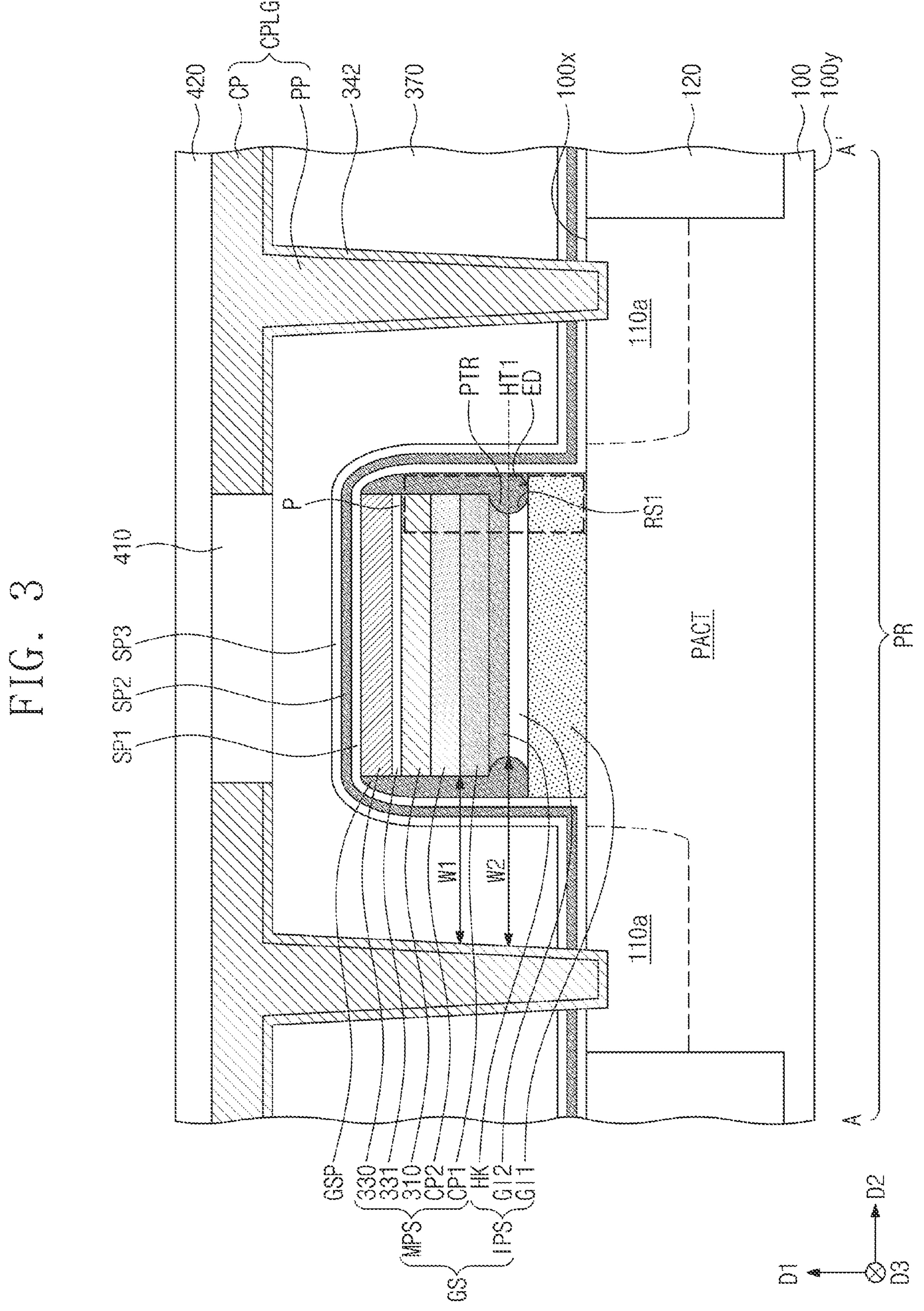
FIG. 3 is a cross-sectional view taken along a line A-A' of FIG. 2 to illustrate a semiconductor device according to some embodiments of the inventive concepts.
Figure 4:
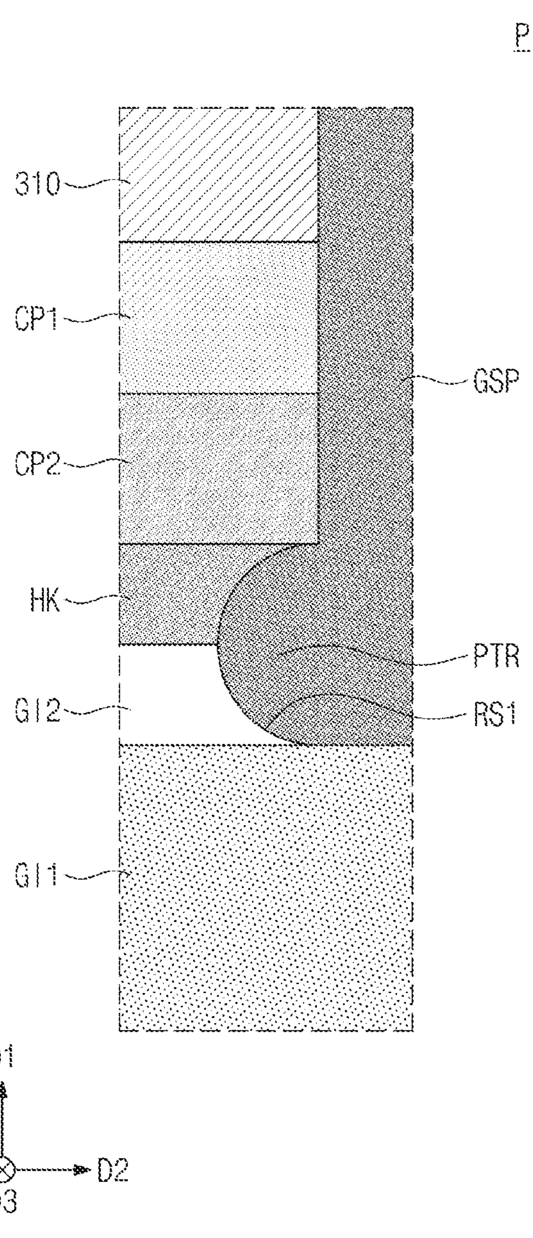
FIG. 4 is an enlarged view of a portion 'P' of FIG. 3.

FIG. 2 is a plan view illustrating a semiconductor device according to some embodiments of the inventive concepts. FIG. 3 is a cross-sectional view taken along a line A-A' of FIG. 2 to illustrate a semiconductor device according to some embodiments of the inventive concepts. FIG. 4 is an enlarged view of a portion 'P' of FIG. 3.

Referring to FIG. 2, a substrate 100 including a peripheral region PR may be provided. The substrate 100 may be a semiconductor substrate. For example, the substrate 100 may be a silicon substrate, a germanium substrate, or a silicon-germanium substrate. In certain embodiments, the substrate 100 may be a silicon-on-insulator (SOI) substrate. The peripheral region PR may be a region of the substrate 100, on which at least a portion of the peripheral block PB of FIG. 1 is provided.

Referring to FIGS. 2 and 3, a peripheral active pattern PACT may be provided on the peripheral region PR. The peripheral active pattern PACT may be a portion of the substrate 100, which protrudes from the substrate 100 in a first direction D1 perpendicular to a bottom surface 100*y* of the substrate 100. Thus, a top surface 100*x* of the substrate 100 may correspond to a top surface of the peripheral active pattern PACT.

A device isolation layer 120 may be disposed in the substrate 100 to define the peripheral active pattern PACT. For example, the device isolation layer 120 may include silicon oxide, silicon nitride, and/or silicon oxynitride.

In the present specification, the first direction D1 may be defined as a direction perpendicular to the bottom surface 100*y* of the substrate 100. A second direction D2 may be defined as a direction which intersects the first direction D1 and is parallel to the bottom surface 100*y* of the substrate 100. A third direction D3 may be defined as a direction which intersects the first direction D1 and the second direction D2 and is parallel to the bottom surface 100*y* of the substrate 100.

Dopant regions 110*a* may be provided in the peripheral active pattern PACT. The dopant regions 110*a* may be provided in both edge regions of the peripheral active pattern PACT. The dopant regions 110*a* can be adjacent to the device isolation layer 120 on opposite sides of the peripheral active pattern PACT, where the dopant regions 110*a* may form an interface with the device isolation layer 120. The dopant regions 110*a* may include N-type or P-type dopants.

A gate structure GS may be provided on the peripheral active pattern PACT, where the gate structure may overly a portion of the peripheral active pattern PACT. The gate structure GS may intersect the peripheral active pattern PACT in the third direction D3. The gate structure GS may include an insulating pattern structure IPS and a metal pattern structure MPS on the insulating pattern structure IPS, where the insulating pattern structure IPS can electrically insulate the metal pattern structure MPS from the peripheral active pattern PACT. The insulating pattern structure IPS may include a first gate insulating pattern GI1, a second gate insulating pattern GI2 and a high-k dielectric layer HK, which are sequentially stacked on the top surface of the peripheral active pattern PACT. The insulating pattern structure IPS may include a first gate insulating pattern GI1 and a high-k dielectric layer HK, which are sequentially stacked on the top surface of the substrate. A second gate insulating pattern GI2 can be stacked between the first gate insulating pattern GI1 and the high-k dielectric layer HK, where the second gate insulating pattern GI2 and the first gate insulating pattern GI1 can be different insulating materials. The metal pattern structure MPS may include a first conductive pattern CP1, a second conductive pattern CP2, a gate pattern 310, a barrier pattern 331 and a metal-containing pattern 330, which are sequentially stacked on the insulating pattern structure IPS, where the insulating pattern structure IPS can physically separate the metal pattern structure MPS from the peripheral active pattern PACT. The first conductive pattern CP1 and the second conductive pattern CP2 can include different metals.

The first gate insulating pattern GI1 may correspond to a lower portion of the gate structure GS. The second gate insulating pattern GI2 may be disposed on the first gate insulating pattern GI1. The first gate insulating pattern GI1 may be disposed between the second gate insulating pattern GI2 and the peripheral active pattern PACT. A width of the first gate insulating pattern GI1 in the second direction D2 may be greater than a width of the second gate insulating pattern GI2 in the second direction D2. An edge portion ED of a top surface of the first gate insulating pattern GI1 may be exposed from the second gate insulating pattern GI2 to the outside in the second direction D2. The width of the first gate insulating pattern GI1 in the second direction D2 may be greater than widths, in the second direction D2, of the high-k dielectric layer HK, the first conductive pattern CP1, the second conductive pattern CP2, the gate pattern 310, the barrier pattern 331 and the metal-containing pattern 330. Thus, an edge portion ED of a top surface of the first gate insulating pattern GI1 may be exposed from the high-k dielectric layer HK, the first conductive pattern CP1, the second conductive pattern CP2, the gate pattern 310, the barrier pattern 331 and the metal-containing pattern 330 to the outside. The width of the first gate insulating pattern GI1 in the second direction D2 may be less than the distance between the device isolation layer 120.

The first gate insulating pattern GI1 and the second gate insulating pattern GI2 may include different insulating materials. For example, the first gate insulating pattern GI1 may include an insulating material such as silicon oxynitride. For example, the second gate insulating pattern GI2 may include an insulating material such as silicon oxide.

The high-k dielectric layer HK may be disposed on the second gate insulating pattern GI2. The second gate insulating pattern GI2 may be disposed between the first gate insulating pattern GI1 and the high-k dielectric layer HK. The high-k dielectric layer HK may include a high-k dielectric material. In the present specification, the high-k dielectric material may be referred to as a material having a dielectric constant higher than that of silicon oxide ($SiO_2$). For example, the high-k dielectric material may be a material including at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO).

The first conductive pattern CP1 may be disposed on the high-k dielectric layer HK. The high-k dielectric layer HK may be disposed between the second gate insulating pattern GI2 and the first conductive pattern CP1. The first conductive pattern CP1 may include a metal having a P work function. For example, the first conductive pattern CP1 may include at least one of aluminum (Al), aluminum oxide, titanium nitride (TiN), tungsten nitride (WN), or ruthenium oxide ($RuO_2$).

The second conductive pattern CP2 may be disposed on the first conductive pattern CP1. The first conductive pattern CP1 may be disposed between the high-k dielectric layer HK and the second conductive pattern CP2. The second conductive pattern CP2 may include a metal having an N work function. For example, the second conductive pattern CP2 may include at least one of lanthanum (La), lanthanum oxide (LaO), tantalum (Ta), tantalum nitride (TaN), niobium (Nb), or titanium nitride (TiN).

The gate pattern 310 may be disposed on the second conductive pattern CP2. The second conductive pattern CP2 may be disposed between the first conductive pattern CP1 and the gate pattern 310. For example, the gate pattern 310 may include dopant-doped poly-silicon or undoped poly-silicon.

The barrier pattern 331 may be disposed on the gate pattern 310. The gate pattern 310 may be disposed between the second conductive pattern CP2 and the barrier pattern 331. For example, the barrier pattern 331 may include a metal nitride (e.g., TiN, TSN, TaN, etc.). A peripheral ohmic pattern may be provided between the barrier pattern 331 and the gate pattern 310, and the peripheral ohmic pattern may include, for example, a metal silicide.

The metal-containing pattern 330 may be disposed on the barrier pattern 331. The barrier pattern 331 may be disposed between the gate pattern 310 and the metal-containing pattern 330. For example, the metal-containing pattern 330 may include a metal (e.g., tungsten, titanium, tantalum, etc.).

A gate spacer GSP may cover at least a portion of a side surface of the gate structure GS. The gate spacer GSP may extend from a top surface of the first gate insulating pattern GI1 to the top surface of the metal-containing pattern 330. More particularly, the gate spacer GSP may cover side surfaces of the second gate insulating pattern GI2, the high-k dielectric layer HK, the first conductive pattern CP1, the second conductive pattern CP2, the gate pattern 310, the barrier pattern 331 and the metal-containing pattern 330. The gate spacer GSP may cover at least a portion of the edge portion ED of the top surface of the first gate insulating pattern GI1. The gate spacer GSP may fill a first recess RS1 in the second gate insulating pattern GI2 and the high-k dielectric layer HK, where the gate spacer GSP may have a protrusion PTR inserted in the first recess RS1. The first recess RS1 may be located between a bottom surface of the second gate insulating pattern GI2 and a top surface of the high-k dielectric layer HK. The gate spacer GSP may extend in the third direction D3. The gate spacer GSP may include an insulating material such as silicon nitride.

Referring to FIGS. 3 and 4, the insulating pattern structure IPS of the gate structure GS may include a first recess RS1 having a maximum depth in the second direction D2 at a first height HT1. The first recess RS1 and the first height HT1 may be located between a bottom surface of the second gate insulating pattern GI2 and a top surface of the high-k dielectric layer HK. The width of the second gate insulating pattern GI2 in the second direction D2 and the width of the high-k dielectric layer HK in the second direction D2 may be less than the widths, in the second direction D2, of the other components of the gate structure GS. The first recess RS1 may be formed in the second gate insulating pattern GI2 and the high-k dielectric layer HK, where the first recess RS1 may be between the bottom surface of the second conductive pattern CP2 and the top surface of the first gate insulating pattern GI1. The first height HT1 may be located at about an interface between the second gate insulating pattern GI2 and the high-k dielectric layer HK.

The gate spacer GSP may have a protrusion PTR inserted in the first recess RS1. A width of the gate spacer GSP in the second direction D2 may have a maximum value at a certain level of the protrusion PTR. In other words, the width of the gate spacer GSP in the second direction D2 may be greater at the same levels as the second gate insulating pattern GI2 and the high-k dielectric layer HK than at the same levels as the first conductive pattern CP1, the second conductive pattern CP2, the gate pattern 310, the barrier pattern 331 and the metal-containing pattern 330. The first recess RS1 may have a curved surface along the second gate insulating pattern GI2 and the high-k dielectric layer HK.

The side surfaces of at least some components of the gate structure GS may be aligned with each other, where aligned surfaces can be coplanar. More particularly, the side surfaces of the first conductive pattern CP1, the second conductive pattern CP2, the gate pattern 310, the barrier pattern 331 and the metal-containing pattern 330 may be aligned with each other. In various embodiments, the side surface of the second gate insulating pattern GI2 and the side surface of the high-k dielectric layer HK may not be aligned with the side surfaces of the other components of the gate structure GS.

Referring again to FIG. 3, a first spacer SP1 may be provided to cover the gate structure GS, the gate spacer GSP, and at least a portion of the top surface 100*x* of the substrate 100, where the first spacer SP1 can be a layer on the peripheral active pattern PACT that extends up the sidewalls of the first gate insulating pattern GI1 and gate spacer GSP, and over the metal-containing pattern 330. The first spacer SP1 may extend in the second direction D2 and the third direction D3 on the top surface 100*x* of the substrate 100. A second spacer SP2 and a third spacer SP3 may be sequentially stacked on the first spacer SP1. The second spacer SP2 and the third spacer SP3 may extend in the second direction D2 and the third direction D3 on the top surface 100*x* of the substrate 100. The first spacer SP1 and the third spacer SP3 may include a first material. The second spacer SP2 may include a second material. The first material may be different from the second material. For example, the first material may include silicon oxide. For example, the second material may include at least one of silicon nitride or silicon oxynitride. For example, the second material may be the same as the material included in the gate spacer GSP.

A lower insulating pattern 370 may cover the gate structure GS. The lower insulating pattern 370 may cover a top surface of the third spacer SP3. The lower insulating pattern 370 may include silicon oxide.

A contact plug CPLG may be disposed at a side of the gate structure GS. Another contact plug CPLG may be disposed at another side of the gate structure GS. For example, the contact plug CPLG may include a metal-containing material such as tungsten.

The contact plug CPLG may include a contact pad CP and a through-plug PP. The contact pad CP may be provided on a top surface of the lower insulating pattern 370. The through-plug PP may extend from a bottom surface of the contact pad CP toward the substrate 100. The through-plug PP may penetrate the lower insulating pattern 370 in the first direction D1 and may be connected to the substrate 100, where the contact plug CPLG can be in electrical contact with the dopant region 110*a*. More particularly, the through-plug PP may be electrically connected to a corresponding one of the dopant regions 110*a* of the substrate 100, where the through-plug PP may be electrically connected to the dopant region 110*a* through a diffusion barrier pattern 342. The lower insulating pattern 370 may continuously extend from the bottom surface of the contact pad CP to a lower portion of the through-plug PP.

The contact pad CP may be disposed on the through-plug PP and may be physically and electrically connected to the through-plug PP. Widths of the contact pad CP in the second direction D2 and the third direction D3 may be greater than widths of the through-plug PP in the second direction D2 and the third direction D3. A region in which the contact pad CP is provided may include a region in which the through-plug PP is provided, when viewed in a plan view. For example, the width of the through-plug PP in the second direction D2 or the third direction D3 may be progressively greater from a bottom end of the through-plug PP toward a top end of the through-plug PP forming a tapered shape.

A diffusion barrier pattern 342 may be provided between the contact plug CPLG and the lower insulating pattern 370. In detail, the diffusion barrier pattern 342 may be disposed between the bottom surface of the contact pad CP and the top surface of the lower insulating pattern 370 and between a side surface of the through-plug PP and a side surface of the lower insulating pattern 370, and may cover a bottom surface of the through-plug PP. The diffusion barrier pattern 342 may be in physical contact with the contact plug CPLG and the lower insulating pattern 370. The diffusion barrier pattern 342 may be in physical and electrical contact with the contact plug CPLG and the dopant region 110*a*. In certain embodiments, the diffusion barrier pattern 342 may be omitted. In various embodiments, the diffusion barrier pattern 342 may include a metal nitride such as titanium nitride or tantalum nitride.

A separation insulating pattern 410 may be provided on the lower insulating pattern 370. The separation insulating pattern 410 may be disposed between a pair of the contact plugs CPLG disposed at both sides of the gate structure GS. The pair of contact plugs CPLG may be electrically insulated from each other by the lower insulating pattern 370 and the separation insulating pattern 410. A top surface of the separation insulating pattern 410 may be coplanar with a top surface of the contact pad CP.

A distance from the side surface of the through-plug PP of the contact plug CPLG or a side surface of the diffusion barrier pattern 342 to one of the side surfaces of the first conductive pattern CP1, the second conductive pattern CP2, the gate pattern 310, the barrier pattern 331 and the metal-containing pattern 330 may be a first distance W1. A distance from the side surface of the through-plug PP of the contact plug CPLG or the side surface of the diffusion barrier pattern 342 to a bottom surface of the first recess RS1 may be a second distance W2. The bottom surface of the first recess RS1 may be a side surface of the gate structure GS or a side surface of the insulating pattern structure IPS, which is most deeply recessed in a horizontal direction toward a center of the gate structure GS. The second distance W2 may be greater than the first distance W1. The second distance W2 may be in a range of about 30 nm to about 100 nm. A distance from the side surface of the through-plug PP of the contact plug CPLG or the side surface of the diffusion barrier pattern 342 to a side surface of the first gate insulating pattern GI1 may be less than the first distance W1 and the second distance W2.

According to the inventive concepts, the insulating pattern structure IPS of the gate structure GS may include the first recess RS1 having the maximum depth in the second direction D2 at the first height HT1. The first recess RS1 may be located between the bottom surface of the second gate insulating pattern GI2 and the top surface of the high-k dielectric layer HK. Therefore, the second distance W2 corresponding to the distance from the side surface of the through-plug PP of the contact plug CPLG to the distal surface of the first recess RS1 may be greater than the first distance W1 corresponding to the distance from the side surface of the through-plug PP of the contact plug CPLG to the side surface of the metal pattern structure MPS of the gate structure GS. Thus, a parasitic capacitance generated at the second gate insulating pattern GI2 and the high-k dielectric layer HK and interference of the contact plug CPLG on the gate structure GS may be minimized without reducing a total thickness of the gate structure GS. In particular, in the case in which the second distance W2 is 30 nanometers (nm) or more, the interference of the contact plug CPLG on the gate structure GS may be significantly reduced. As a result, the electrical characteristics and reliability of the semiconductor device may be improved.

An etch stop pattern 420 may cover the contact pad CP. For example, the etch stop pattern 420 may include SiBN. The etch stop pattern 420 may include a single layer or a multi-layer.

FIGS. 5 to 8 are cross-sectional views taken along the line A-A' of FIG. 2 to illustrate a method of manufacturing a semiconductor device according to some embodiments of the inventive concepts.

Figure 5:
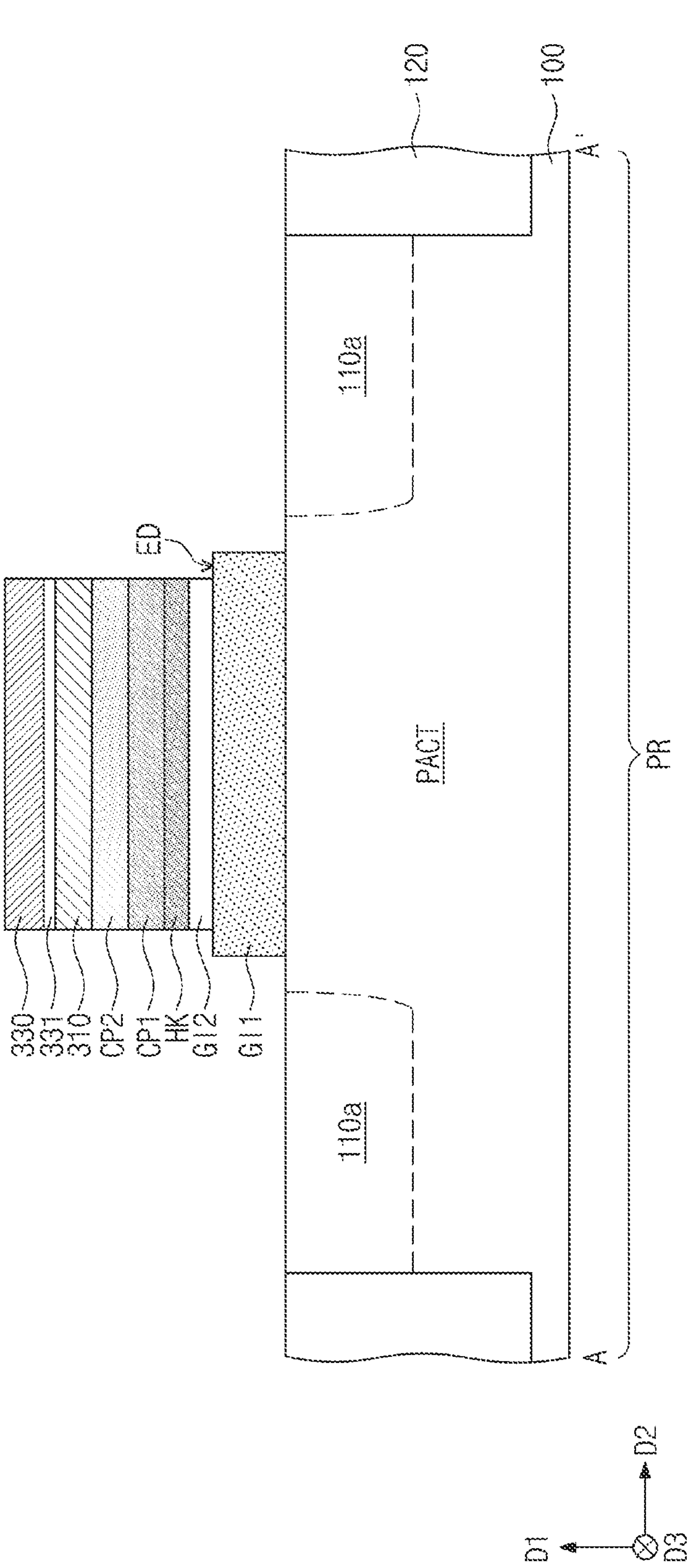
FIGS. 5 to 8 are cross-sectional views taken along the line A-A' of FIG. 2 to illustrate a method of manufacturing a semiconductor device according to some embodiments of the inventive concepts.

Referring to FIG. 5, a device isolation layer 120 may be formed on a peripheral region PR of a substrate 100, and a peripheral active pattern PACT may be defined by the device isolation layer 120. Dopant regions 110*a* may be formed in the peripheral active pattern PACT.

A gate structure GS may be formed on the peripheral active pattern PACT. More particularly, a first gate insulating pattern GI1, a second gate insulating pattern GI2, a high-k dielectric layer HK, a first conductive pattern CP1, a second conductive pattern CP2, a gate pattern 310, a barrier pattern 331 and a metal-containing pattern 330 may be sequentially formed on the peripheral active pattern PACT through a patterning process.

A width of the first gate insulating pattern GI1 in the second direction D2 may be greater than widths, in the second direction D2, of the second gate insulating pattern GI2, the high-k dielectric layer HK, the first conductive pattern CP1, the second conductive pattern CP2, the gate pattern 310, the barrier pattern 331 and the metal-containing pattern 330. An edge portion ED of a top surface of the first gate insulating pattern GI1 may be exposed from the second gate insulating pattern GI2, the high-k dielectric layer HK, the first conductive pattern CP1, the second conductive pattern CP2, the gate pattern 310, the barrier pattern 331 and the metal-containing pattern 330 to the outside. The edge portion ED of a top surface of the first gate insulating pattern GI1 can form a step between the top surface of the peripheral active pattern PACT and the metal-containing pattern 330, where the edge portion ED can extend from a sidewall of the second gate insulating pattern GI2 towards the outside edge of the first gate insulating pattern GI1. The edge portion ED may be damaged by an etching process in the process of forming the second gate insulating pattern GI2, the high-k dielectric layer HK, the first conductive pattern CP1, the second conductive pattern CP2, the gate pattern 310, the barrier pattern 331 and the metal-containing pattern 330. Thus, electrical characteristics of a semiconductor device may be deteriorated.

Figure 6:
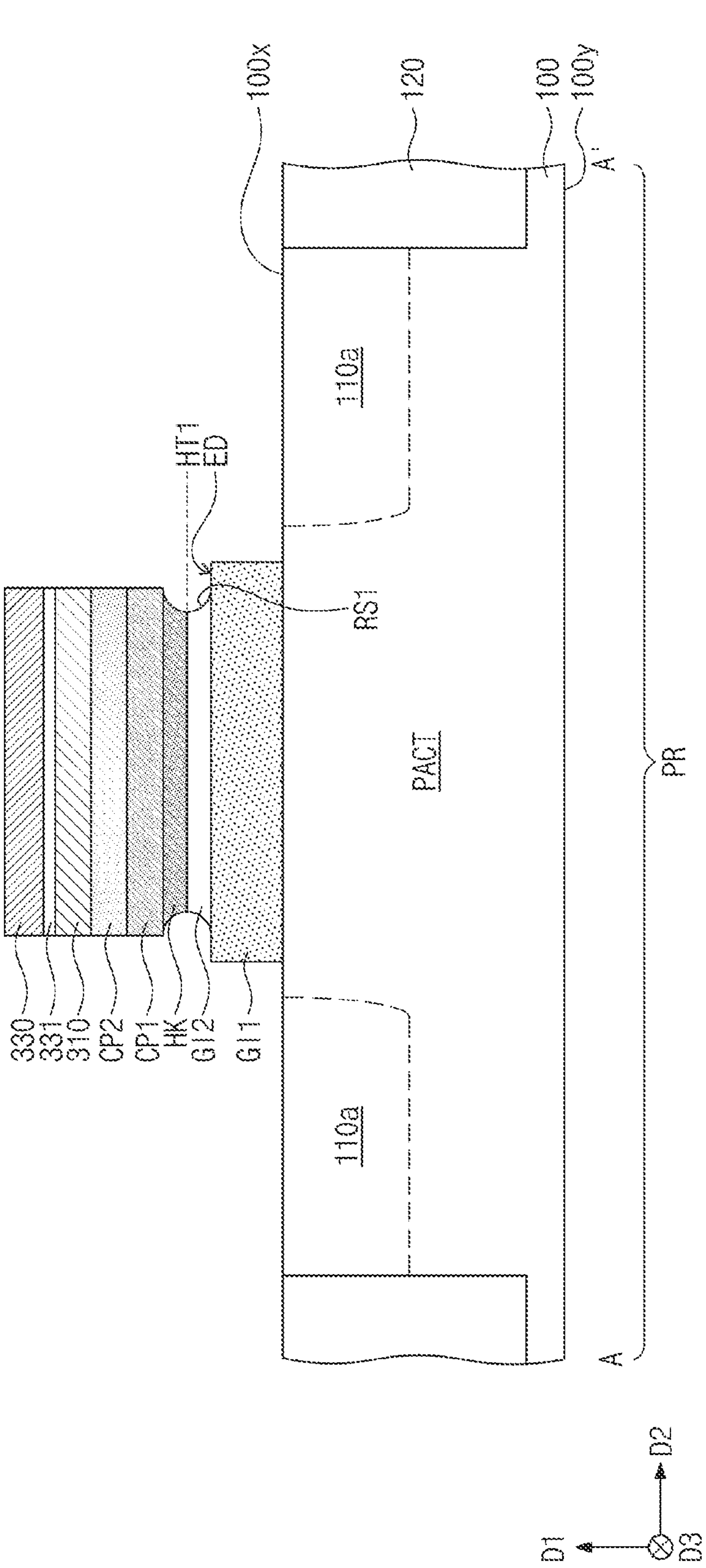

Referring to FIG. 6, a portion of the gate structure GS may be removed to form a first recess RS1 having a maximum depth in the second direction D2 at a first height HT1 from a top surface 100*x* of the substrate 100. At least a portion of the second gate insulating pattern GI2 and at least a portion of the high-k dielectric layer HK may be selectively removed to form the first recess RS1. The formation of the first recess RS1 may be performed using a wet etching process.

In the wet etching process, etch rates of the second gate insulating pattern GI2 and the high-k dielectric layer HK may be higher than etch rates of the first gate insulating pattern GI1, the first conductive pattern CP1, the second conductive pattern CP2, the gate pattern 310, the barrier pattern 331 and the metal-containing pattern 330. The etching may form an inwardly-curved surface. For example, the wet etching process may use a sulfuric acid hydrogen peroxide mixture (SPM) solution including a low concentration of hydrogen peroxide ($H_2O_2$). More particularly, the SPM solution may include sulfuric acid ($H_2SO_4$), hydrogen peroxide ($H_2O_2$), an inhibitor, and distilled water ($H_2O$). A concentration of the sulfuric acid ($H_2SO_4$) may range from 89 wt % (weight percent) to 93 wt %. A temperature of the sulfuric acid ($H_2SO_4$) may range from 5° C. to 30° C. A concentration of the hydrogen peroxide (HO) may range from 0.25 wt % to 1 wt %. The inhibitor may include an ammonium salt compound. A concentration of the inhibitor may range from 0.01 wt % to 0.1 wt %. A concentration of the distilled water ($H_2O$) may range from 6 wt % to 10 wt %.

Figure 7:
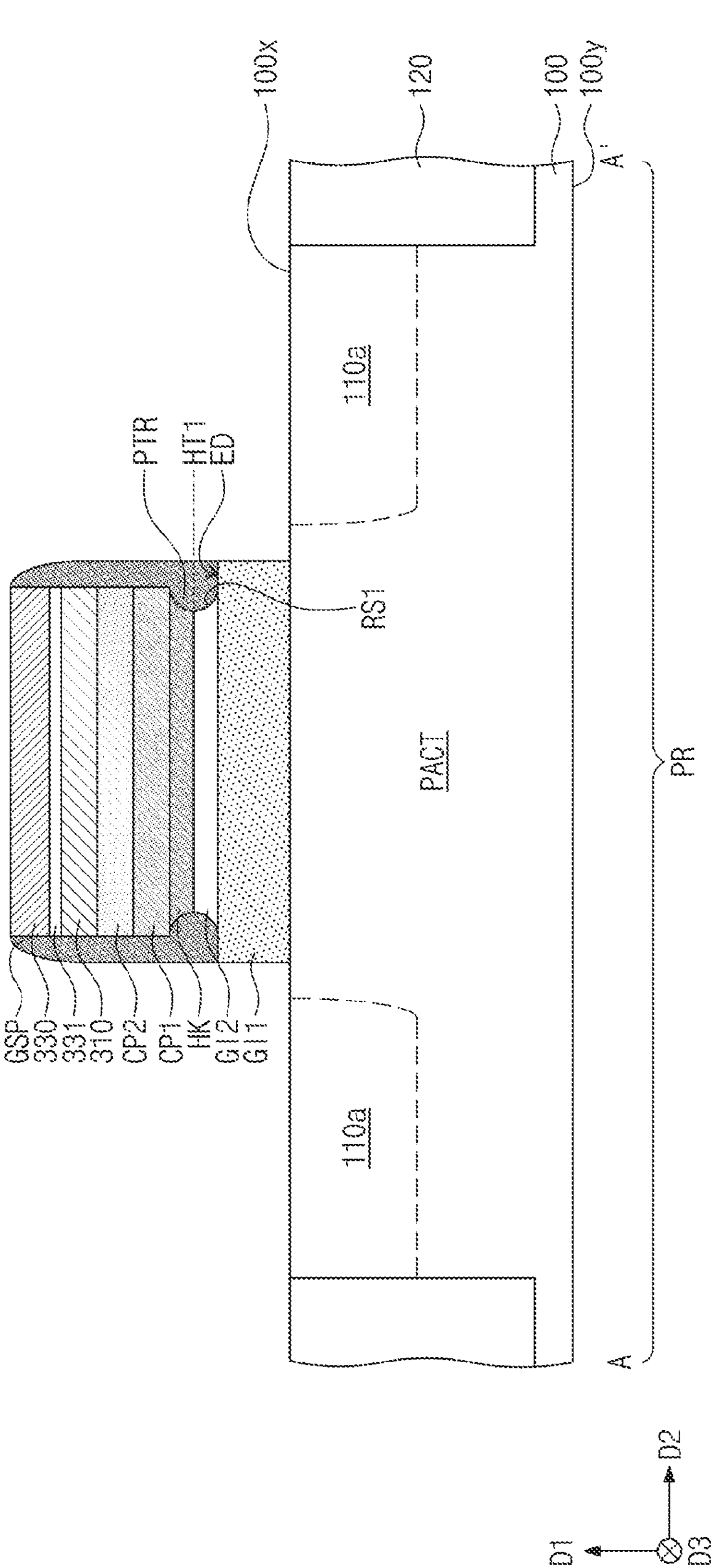

Referring to FIG. 7, a gate spacer GSP may be formed. The formation of the gate spacer GSP may include forming a gate spacer layer covering the gate structure GS and at least a portion of the top surface 100*x* of the substrate 100, performing exposure and development processes to form a photomask pattern on the gate spacer layer, and performing a dry etching process on the gate spacer layer by using the photomask pattern as an etch mask. The gate spacer GSP may cover side surfaces of the first conductive pattern CP1, the second conductive pattern CP2, the gate pattern 310, the barrier pattern 331 and the metal-containing pattern 330. The gate spacer GSP may have a protrusion PTR inserted in the first recess RS1. The protrusion PTR may cover a side surface of the second gate insulating pattern GI2 and a side surface of the high-k dielectric layer HK. A side surface of the gate spacer GSP may be aligned with a side surface of the first gate insulating pattern GI1, where the gate spacer GSP may cover the step formed by the first gate insulating pattern GI1.

Figure 8:
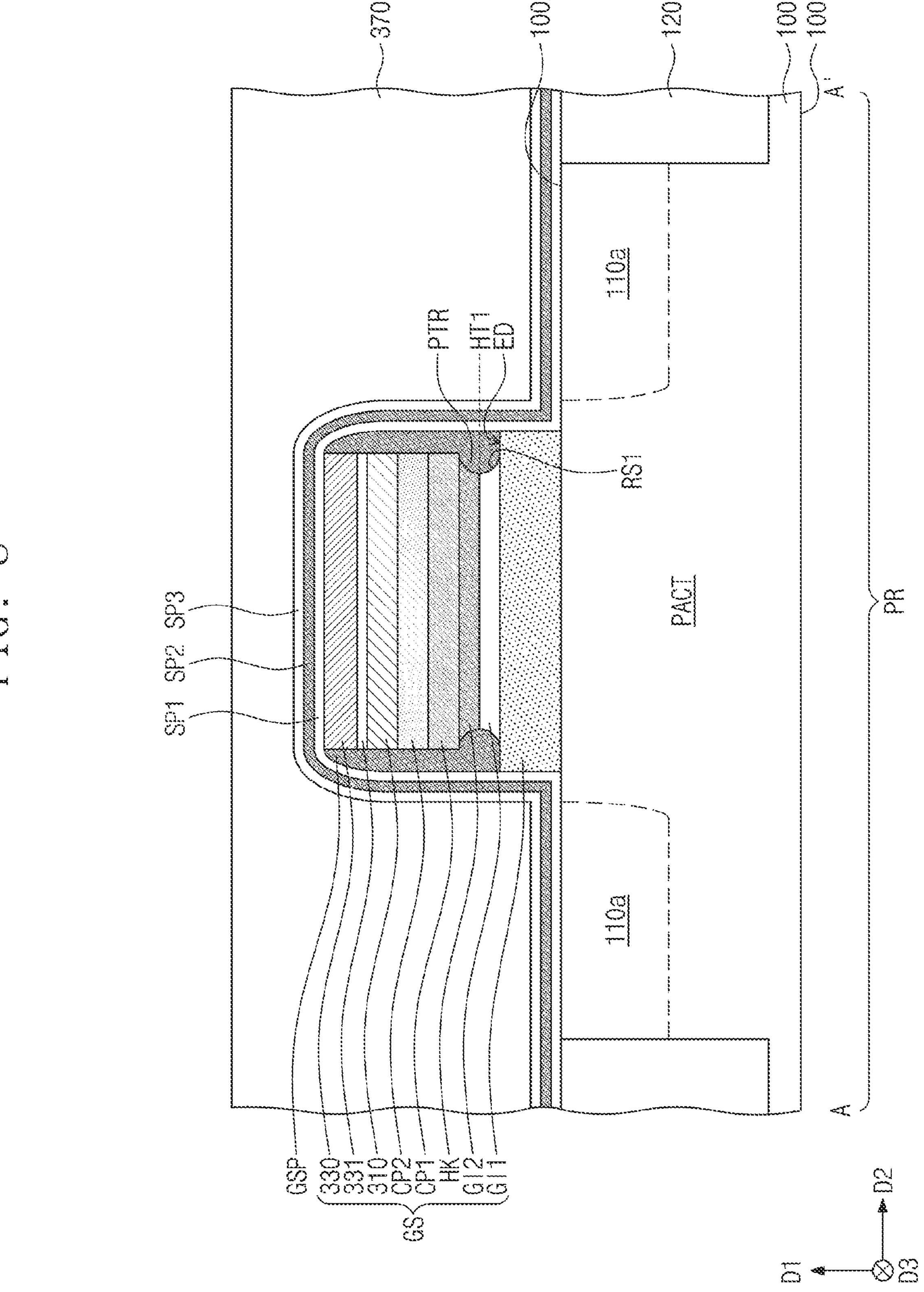

Referring to FIG. 8, a first spacer SP1 may be formed to cover the gate structure GS, at least a portion of the top surface 100*x* of the substrate 100, and at least a portion of the gate spacer GSP. A second spacer SP2 may be sequentially formed on the first spacer SP1, and a third spacer SP3 may be sequentially formed on the second spacer SP2. The first spacer SP1 may extend from a top surface of the metal-containing pattern 330 onto the side surface of the gate spacer GSP and the side surface of the first gate insulating pattern GI1, and may further extend onto the top surface 100*x* of the substrate 100 and a top surface of the device isolation layer 120. The first spacer SP1, the second spacer SP2 and the third spacer SP3 may be formed using an atomic layer deposition (ALD) method.

A lower insulating pattern 370 may be formed on the third spacer SP3, where the lower insulating pattern 370 can cover the gate structure GS, dopant regions 110*a*, and the device isolation layer 120. The lower insulating pattern 370 may be formed using a chemical vapor deposition (CVD) method, a physical vapor deposition (PVD) method, or an atomic layer deposition (ALD) method.

Referring again to FIG. 3, a diffusion barrier pattern 342 may be formed in a through-hole penetrating the lower insulating pattern 370. A contact plug CPLG may be formed on the diffusion barrier pattern 342. The contact plug CPLG may include a contact pad CP and a through-plug PP. The contact pad CP may be provided on a top surface of the lower insulating pattern 370. The contact pad CP may continuously extend in the second direction D2, where the contact pad CP can overlie the gate structure GS. The through-plug PP may extend from a bottom surface of the contact pad CP toward the substrate 100. The through-plug PP may penetrate the lower insulating pattern 370 in the first direction D1 and may be connected to the substrate 100, where the through-plug PP may extend into the dopant regions 110*a*. The diffusion barrier pattern 342 and the through-plug PP of the contact plug CPLG may further penetrate the first spacer SP1, the second spacer SP2 and the third spacer SP3. The lower insulating pattern 370 may continuously extend from the bottom surface of the contact pad CP to a lower portion of the through-plug PP.

A separation insulating pattern 410 may be formed to be provided on the lower insulating pattern 370 and to cut the contact pad CP in a region vertically overlapping with the gate structure GS. The formation of the separation insulating pattern 410 may include forming a photoresist material on the contact pad CP, performing exposure and development processes on the photoresist material to form a photomask pattern, and performing a dry etching process on the contact pad CP using the photomask pattern as an etch mask, where a portion of the contact pad CP can be removed. After the dry etching process is performed, the continuously extending contact pad CP may be divided into a pair of contact pads CP spaced apart from each other with the gate structure GS interposed therebetween in a plan view. Thus, a pair of the contact plugs CPLG may be electrically insulated from each other with the gate structure GS interposed therebetween.

An etch stop pattern 420 may be formed on the contact pad CP of the contact plug CPLG.

Figure 9:
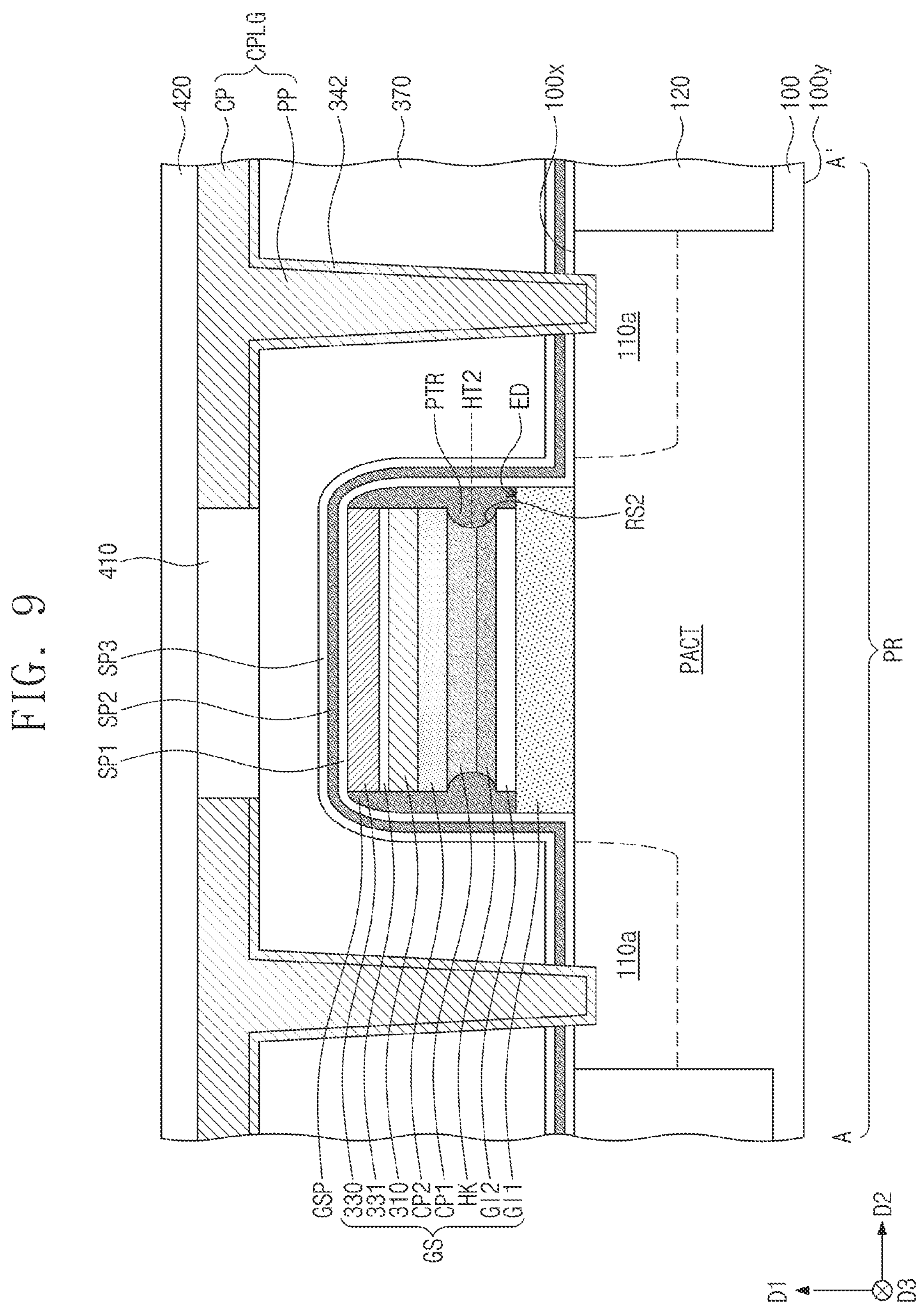
FIG. 9 is a cross-sectional view taken along the line A-A' of FIG. 2 to illustrate a semiconductor device according to some embodiments of the inventive concepts.

FIG. 9 is a cross-sectional view taken along the line A-A' of FIG. 2 to illustrate a semiconductor device according to some embodiments of the inventive concepts. Hereinafter, the descriptions to the same features as mentioned above in FIGS. 3 and 4 will be omitted and differences between the present embodiments and the above embodiments of FIGS. 3 and 4 will be mainly described, for the purpose of ease and convenience in explanation.

Referring to FIG. 9, the gate structure GS may include a second recess RS2 having a maximum depth in the second direction D2 at a second height HT2 from the top surface 100*x* of the substrate 100, instead of the first recess RS1. The second recess RS2 and the second height HT2 may be located between a bottom surface of the high-k dielectric layer HK and a top surface of the first conductive pattern CP1, where the second height HT2 may be farther from the first gate insulating pattern GI1 than the first height HT1. A width of the high-k dielectric layer HK in the second direction D2 and a width of the first conductive pattern CP1 in the second direction D2 may be less than widths, in the second direction D2, of the other components of the gate structure GS.

The gate spacer GSP may have a protrusion PTR inserted in the second recess RS2. A width of the gate spacer GSP in the second direction D2 may have a maximum value at a certain level of the protrusion PTR, where the gate spacer GSP can have a maximum width where the second recess RS2 has the maximum depth in the second direction D2 at a second height HT2. In other words, the width of the gate spacer GSP in the second direction D2 may be greater at the same levels as the high-k dielectric layer HK and the first conductive pattern CP1 than at the same levels as the second gate insulating pattern GI2, the second conductive pattern CP2, the gate pattern 310, the barrier pattern 331 and the metal-containing pattern 330.

Side surfaces of at least some components of the gate structure GS may be aligned with each other. More particularly, side surfaces of the second conductive pattern CP2, the gate pattern 310, the barrier pattern 331 and the metal-containing pattern 330 may be aligned with each other. On the other hand, a side surface of the high-k dielectric layer HK and a side surface of the first conductive pattern CP1 may not be aligned with side surfaces of the other components of the gate structure GS.

Figure 10:
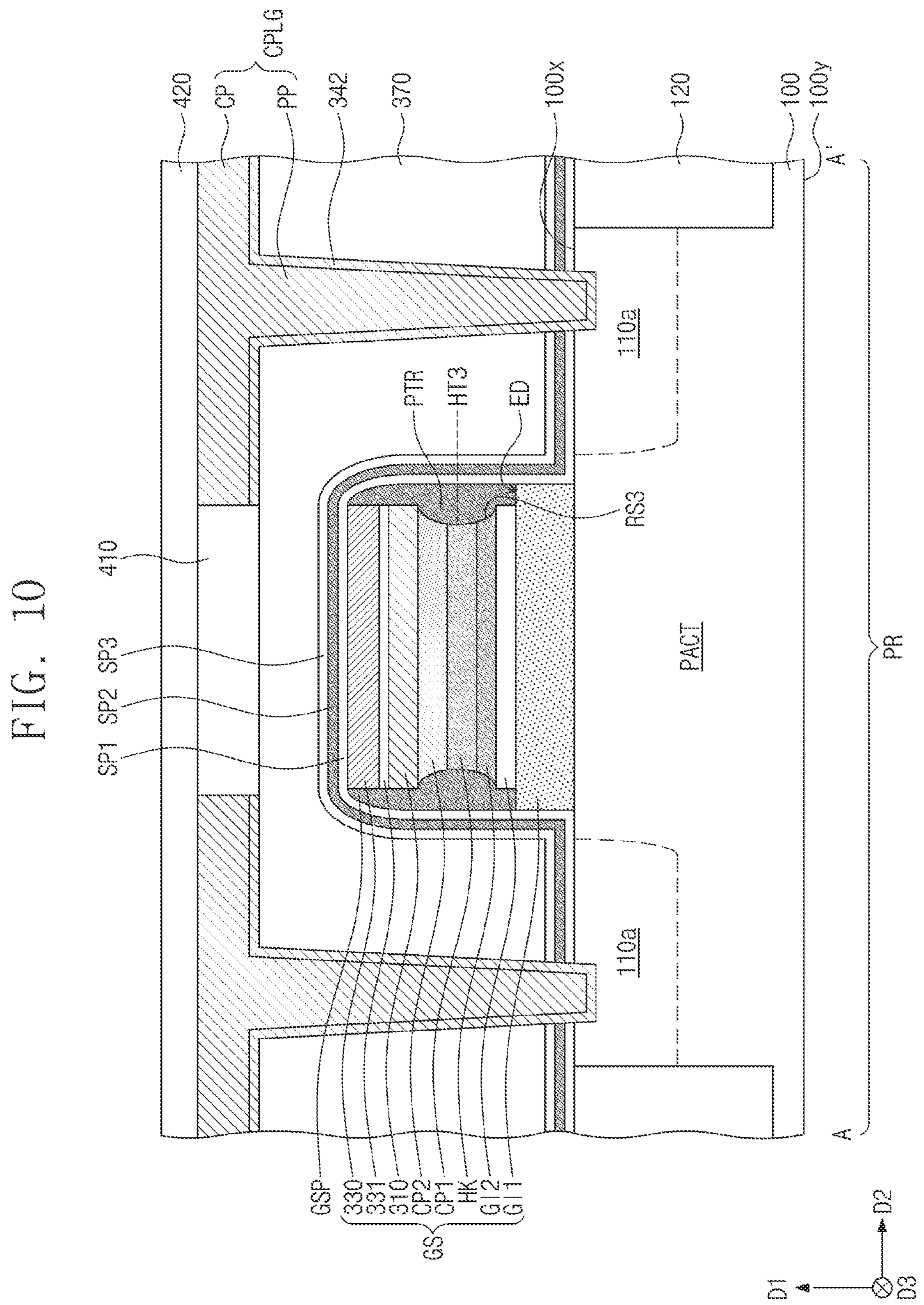
FIG. 10 is a cross-sectional view taken along the line A-A' of FIG. 2 to illustrate a semiconductor device according to some embodiments of the inventive concepts.

FIG. 10 is a cross-sectional view taken along the line A-A' of FIG. 2 to illustrate a semiconductor device according to some embodiments of the inventive concepts. Hereinafter, the descriptions to the same features as mentioned above in FIGS. 3 and 4 will be omitted and differences between the present embodiments and the above embodiments of FIGS. 3 and 4 will be mainly described, for the purpose of ease and convenience in explanation.

Referring to FIG. 10, the gate structure GS may include a third recess RS3 having a maximum depth in the second direction D2 at a third height HT3 from the top surface 100*x* of the substrate 100, instead of the first recess RS1. The third recess RS3 and the third height HT3 may be located between the bottom surface of the high-k dielectric layer HK and a top surface of the second conductive pattern CP2. A width of the high-k dielectric layer HK in the second direction D2, a width of the first conductive pattern CP1 in the second direction D2 and a width of the second conductive pattern CP2 in the second direction D2 may be less than widths, in the second direction D2, of the other components of the gate structure GS.

The gate spacer GSP may have a protrusion PTR inserted in the third recess RS3. A width of the gate spacer GSP in the second direction D2 may have a maximum value at a certain level of the protrusion PTR, where the gate spacer GSP can have a maximum width where the third recess RS3 has the maximum depth in the second direction D2 at the third height HT3. In other words, the width of the gate spacer GSP in the second direction D2 may be greater at the same levels as the high-k dielectric layer HK, the first conductive pattern CP1 and the second conductive pattern CP2 than at the same levels as the second gate insulating pattern GI2, the gate pattern 310, the barrier pattern 331 and the metal-containing pattern 330. The third recess RS3 can have a maximum depth in the second direction D2 at the third height HT3, where the third height HT3 can be between the top surface and bottom surface of the first conductive pattern CP1.

Side surfaces of at least some components of the gate structure GS may be aligned with each other. More particularly, side surfaces of the gate pattern 310, the barrier pattern 331 and the metal-containing pattern 330 may be aligned with each other. On the other hand, a side surface of the high-k dielectric layer HK, a side surface of the first conductive pattern CP1 and a side surface of the second conductive pattern CP2 may not be aligned with the side surfaces of the other components of the gate structure GS. The side surface of the high-k dielectric layer HK, side surface of the first conductive pattern CP1 and side surface of the second conductive pattern CP2 may be curved surfaces.

Figure 11:
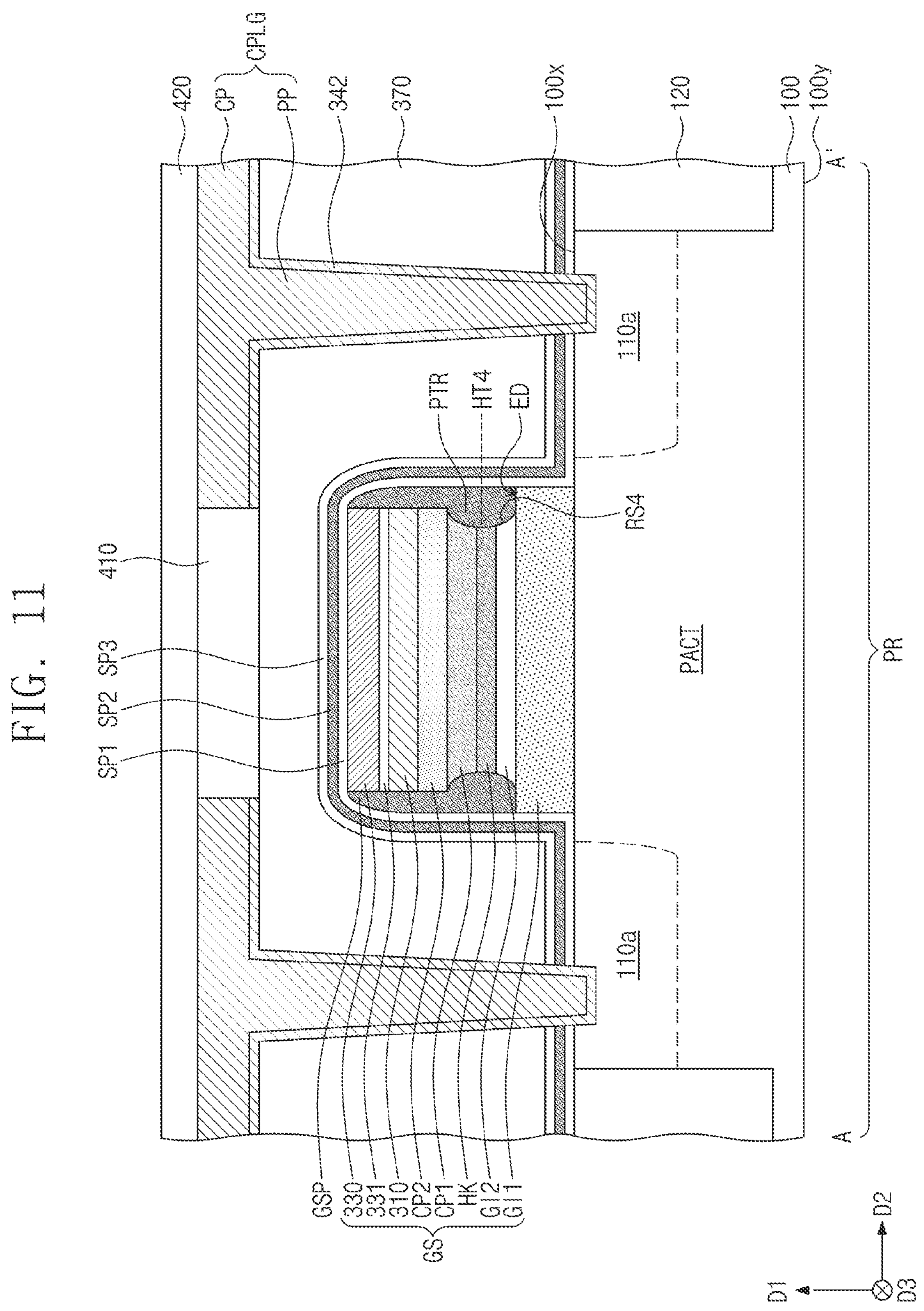
FIG. 11 is a cross-sectional view taken along the line A-A' of FIG. 2 to illustrate a semiconductor device according to some embodiments of the inventive concepts.

FIG. 11 is a cross-sectional view taken along the line A-A' of FIG. 2 to illustrate a semiconductor device according to some embodiments of the inventive concepts. Hereinafter, the descriptions to the same features as mentioned above in FIGS. 3 and 4 will be omitted and differences between the present embodiments and the above embodiments of FIGS. 3 and 4 will be mainly described, for the purpose of ease and convenience in explanation.

Referring to FIG. 11, the gate structure GS may include a fourth recess RS4 having a maximum depth in the second direction D2 at a fourth height HT4 from the top surface 100*x* of the substrate 100, instead of the first recess RS1. The fourth recess RS4 and the fourth height HT4 may be located between the bottom surface of the second gate insulating pattern GI2 and the top surface of the first conductive pattern CP1. A width of the second gate insulating pattern GI2 in the second direction D2, a width of the high-k dielectric layer HK in the second direction D2 and a width of the first conductive pattern CP1 in the second direction D2 may be less than widths, in the second direction D2, of the other components of the gate structure GS.

The gate spacer GSP may have a protrusion PTR inserted in the fourth recess RS4. A width of the gate spacer GSP in the second direction D2 may have a maximum value at a certain level of the protrusion PTR, where the gate spacer GSP can have a maximum width where the fourth recess RS4 has the maximum depth in the second direction D2 at the fourth height HT4. In other words, the width of the gate spacer GSP in the second direction D2 may be greater at the same levels as the second gate insulating pattern GI2, the high-k dielectric layer HK and the first conductive pattern CP1 than at the same levels as the second conductive pattern CP2, the gate pattern 310, the barrier pattern 331 and the metal-containing pattern 330. The fourth recess RS4 can have a maximum depth in the second direction D2 at the fourth height HT4, where the fourth height HT4 can be between the top surface and bottom surface of the high-k dielectric layer HK.

Side surfaces of at least some components of the gate structure GS may be aligned with each other. More particularly, side surfaces of the second conductive pattern CP2, the gate pattern 310, the barrier pattern 331 and the metal-containing pattern 330 may be aligned with each other. On the other hand, a side surface of the second gate insulating pattern GI2, a side surface of the high-k dielectric layer HK and a side surface of the first conductive pattern CP1 may not be aligned with the side surfaces of the other components of the gate structure GS.

Figure 12:
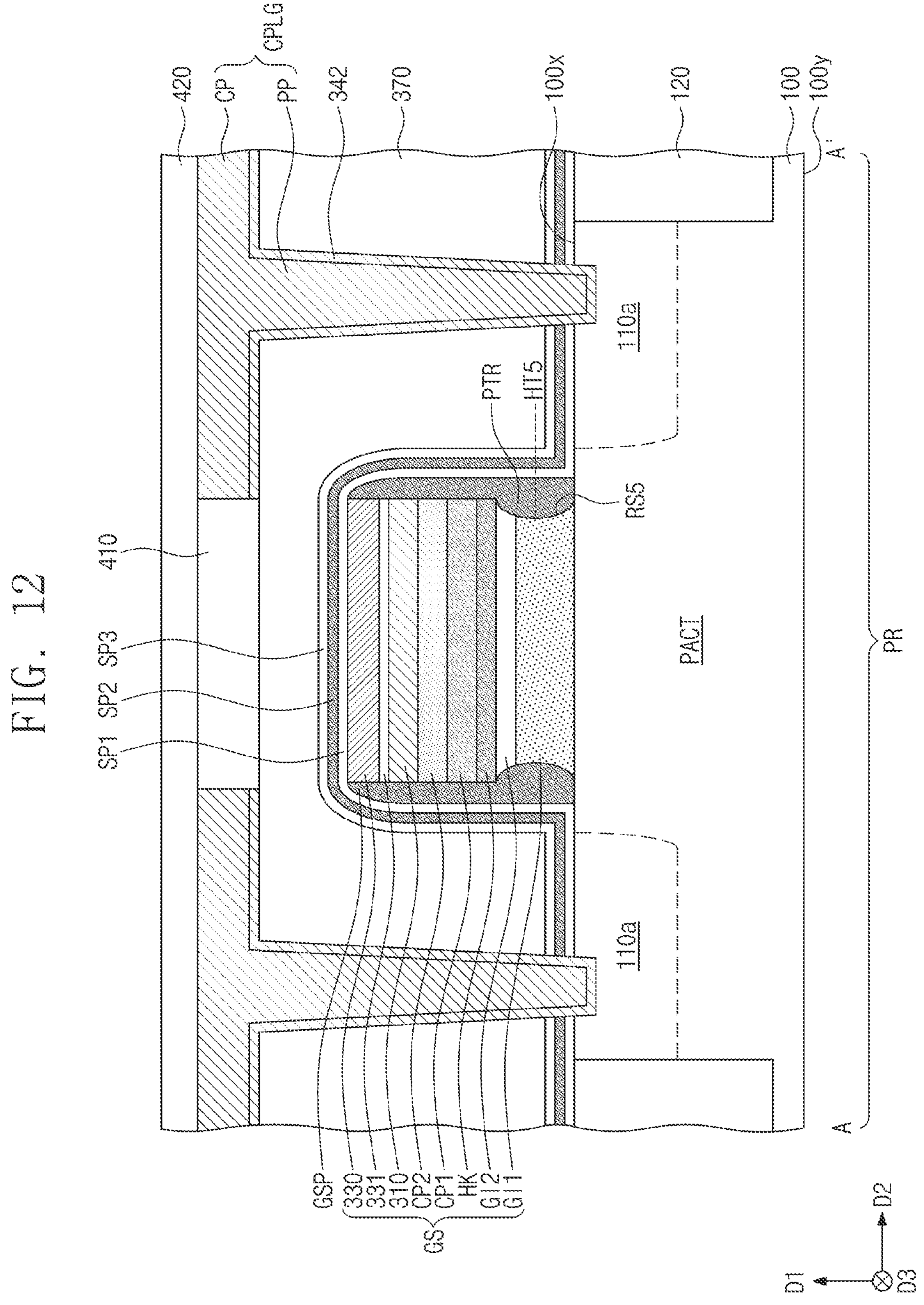
FIG. 12 is a cross-sectional view taken along the line A-A' of FIG. 2 to illustrate a semiconductor device according to some embodiments of the inventive concepts.

FIG. 12 is a cross-sectional view taken along the line A-A' of FIG. 2 to illustrate a semiconductor device according to some embodiments of the inventive concepts. Hereinafter, the descriptions to the same features as mentioned above in FIGS. 3 and 4 will be omitted and differences between the present embodiments and the above embodiments of FIGS. 3 and 4 will be mainly described, for the purpose of ease and convenience in explanation.

Referring to FIG. 12, the gate structure GS may include a fifth recess RS5 having a maximum depth in the second direction D2 at a fifth height HT5 from the top surface 100*x* of the substrate 100, instead of the first recess RS1, where the fifth height HT5 may be closer to the top surface 100*x* of the substrate 100 than the first height HT1. The fifth recess RS5 and the fifth height HT5 may be located between a bottom surface of the first gate insulating pattern GI1 and a top surface of the second gate insulating pattern GI2. A width of the first gate insulating pattern GI1 in the second direction D2 and a width of the second gate insulating pattern GI2 in the second direction D2 may be less than widths, in the second direction D2, of the other components of the gate structure GS. The first gate insulating pattern GI1 may not include the edge portion ED of the top surface of the first gate insulating pattern GI1 in FIG. 3.

The gate spacer GSP may have a protrusion PTR inserted in the fifth recess RS5. A width of the gate spacer GSP in the second direction D2 may have a maximum value at a certain level of the protrusion PTR, where the gate spacer GSP can have a maximum width where the fifth recess RS5 has the maximum depth in the second direction D2 at the fifth height HT5. In other words, the width of the gate spacer GSP in the second direction D2 may be greater at the same levels as the first gate insulating pattern GI1 and the second gate insulating pattern GI2 than at the same levels as the high-k dielectric layer HK, the first conductive pattern CP1, the second conductive pattern CP2, the gate pattern 310, the barrier pattern 331 and the metal-containing pattern 330. The fifth recess RS5 can have a maximum depth in the second direction D2 at the fifth height HT5, where the fifth height HT5 can be between the top surface and bottom surface of the first gate insulating pattern GI1.

Side surfaces of at least some components of the gate structure GS may be aligned with each other. More particularly, side surfaces of the high-k dielectric layer HK, the first conductive pattern CP1, the second conductive pattern CP2, the gate pattern 310, the barrier pattern 331 and the metal-containing pattern 330 may be aligned with each other. In various embodiments, a side surface of the first gate insulating pattern GI1 and a side surface of the second gate insulating pattern GI2 may not be aligned with the side surfaces of the other components of the gate structure GS. The side surface of the first gate insulating pattern GI1 and the side surface of the second gate insulating pattern GI2 may be curved surfaces.

According to some embodiments of the inventive concepts, at least a portion of the first gate insulating pattern GI1 and at least a portion of the second gate insulating pattern GI2 may be selectively removed due to the fifth recess RS5. Thus, the first gate insulating pattern GI1 may not include the edge portion ED of the top surface of the first gate insulating pattern GI1 in FIG. 3. As a result, it is possible to prevent deterioration of electrical characteristics of the semiconductor device.

To manufacture the semiconductor device of FIG. 12, the manufacturing process described with reference to FIGS. 5 to 8 maybe applied, but the wet etching solution in FIG. 6 may use hydrofluoric acid (HF), a diluted sulfuric peroxide (DSP) solution, or a combination thereof.

Figure 13:
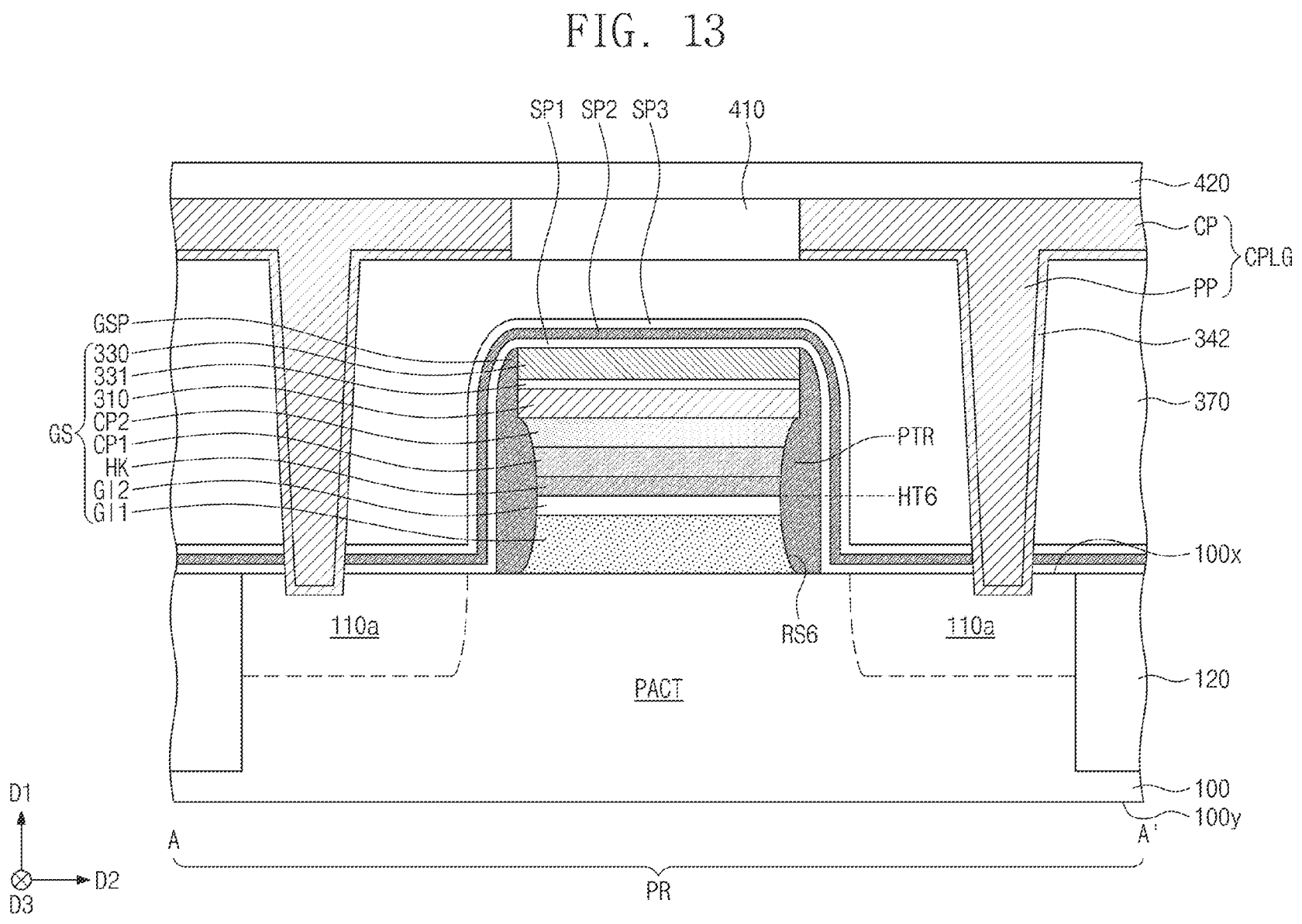

FIG. 13 is a cross-sectional view taken along the line A-A' of FIG. 2 to illustrate a semiconductor device according to some embodiments of the inventive concepts. Hereinafter, the descriptions to the same features as mentioned above in FIGS. 3 and 4 will be omitted and differences between the present embodiments and the above embodiments of FIGS. 3 and 4 will be mainly described, for the purpose of ease and convenience in explanation.

Referring to FIG. 13, the gate structure GS may include a sixth recess RS6 having a maximum depth in the second direction D2 at a sixth height HT6 from the top surface 100*x* of the substrate 100, instead of the first recess RS1. The sixth recess RS6 and the sixth height HT6 may be located between the bottom surface of the first gate insulating pattern GI1 and the top surface of the second conductive pattern CP2. A width of the first gate insulating pattern GI1 in the second direction D2, a width of the second gate insulating pattern GI2 in the second direction D2, a width of the high-k dielectric layer HK in the second direction D2, a width of the first conductive pattern CP1 in the second direction D2 and a width of the second conductive pattern CP2 in the second direction D2 may be less than widths, in the second direction D2, of the other components of the gate structure GS.

The gate spacer GSP may have a protrusion PTR inserted in the sixth recess RS6. A width of the gate spacer GSP in the second direction D2 may have a maximum value at a certain level of the protrusion PTR. In other words, the width of the gate spacer GSP in the second direction D2 may be greater at the same levels as the first gate insulating pattern GI1, the second gate insulating pattern GI2, the high-k dielectric layer HK, the first conductive pattern CP1 and the second conductive pattern CP2 than at the same levels as the gate pattern 310, the barrier pattern 331 and the metal-containing pattern 330.

Side surfaces of at least some components of the gate structure GS may be aligned with each other. More particularly, side surfaces of the gate pattern 310, the barrier pattern 331 and the metal-containing pattern 330 may be aligned with each other. In various embodiments, a side surface of the first gate insulating pattern GI1, a side surface of the second gate insulating pattern GI2, a side surface of the high-k dielectric layer HK, a side surface of the first conductive pattern CP1 and a side surface of the second conductive pattern CP2 may not be aligned with the side surfaces of the other components of the gate structure GS. The side surfaces of the first gate insulating pattern GI1, the second gate insulating pattern GI2, the high-k dielectric layer HK, the first conductive pattern CP1, and the second conductive pattern CP2 may be curved surfaces.

Figure 14:
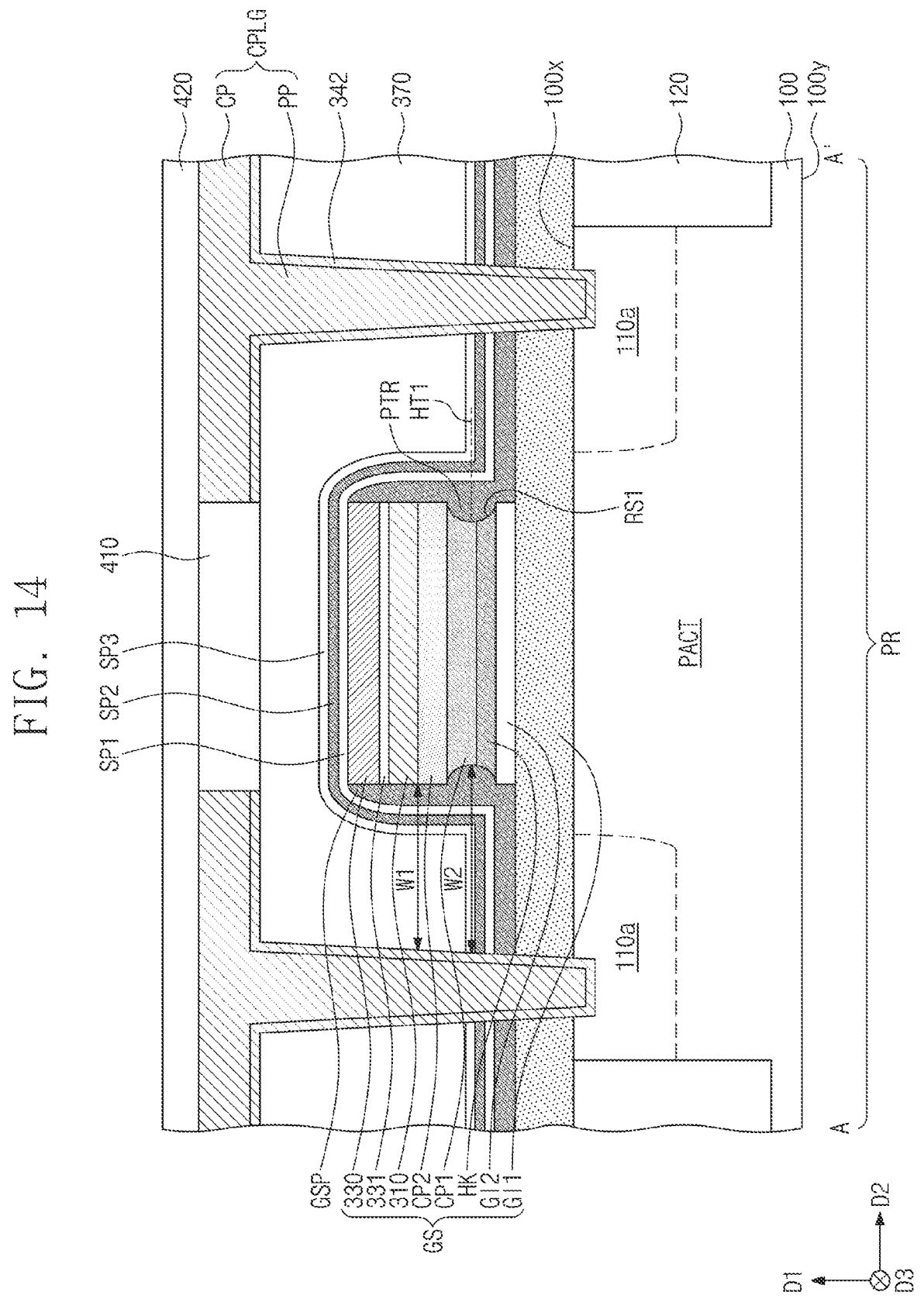

FIG. 14 is a cross-sectional view taken along the line A-A' of FIG. 2 to illustrate a semiconductor device according to some embodiments of the inventive concepts. Hereinafter, the descriptions to the same features as mentioned above in FIGS. 3 and 4 will be omitted and differences between the present embodiments and the above embodiments of FIGS. 3 and 4 will be mainly described, for the purpose of ease and convenience in explanation.

Referring to FIG. 14, the first gate insulating pattern GI1 may further extend in the second direction D2 and the third direction D3. The first gate insulating pattern GI1 may further cover top surfaces of the dopant regions 110*a* and the top surface of the device isolation layer 120.

The gate spacer GSP may further extend in the second direction D2 and the third direction D3. The gate spacer GSP may cover a top surface of the first gate insulating pattern GI1.

The first spacer SP1, the second spacer SP2 and the third spacer SP3 may further cover a top surface of the gate spacer GSP extending in the second direction D2 and the third direction D3. The first spacer SP1, the second spacer SP2 and the third spacer SP3 may be spaced apart from the first gate insulating pattern GI1 with the gate spacer GSP interposed therebetween.

The through-plug PP of the contact plug CPLG may penetrate the first gate insulating pattern GI1, the gate spacer GSP, the first spacer SP1, the second spacer SP2, the third spacer SP3, and the lower insulating pattern 370.

Figure 15:
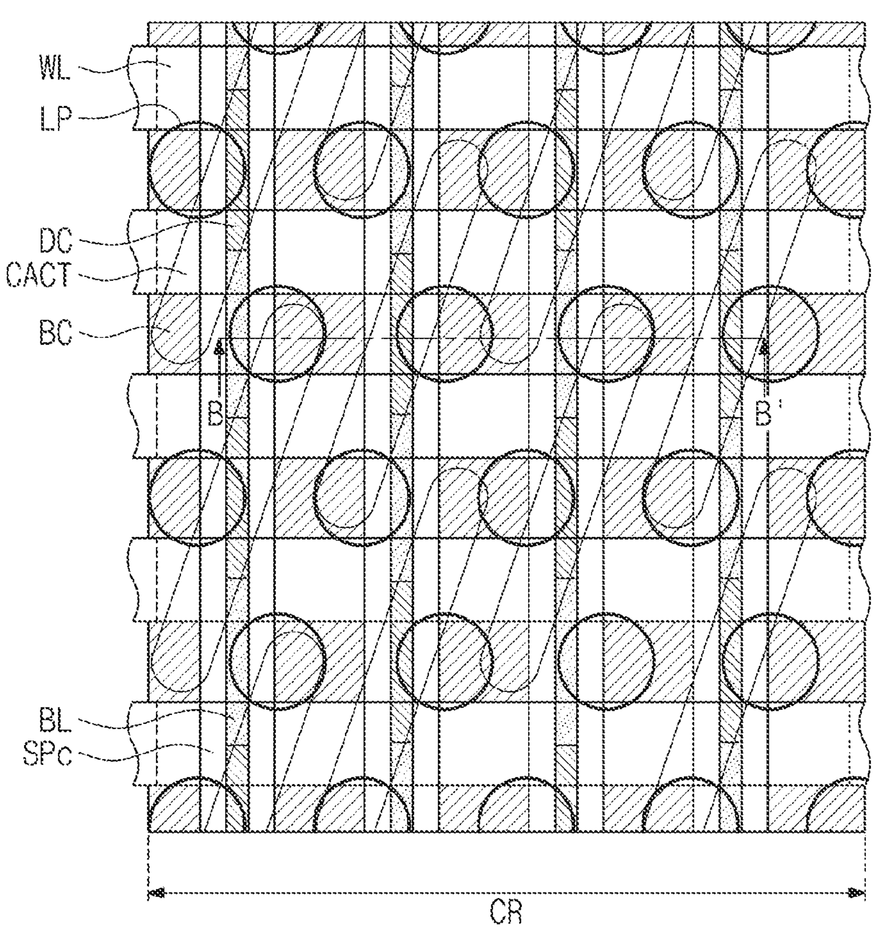
FIG. 15 is a plan view illustrating a semiconductor device according to some embodiments of the inventive concepts.
Figure 15:
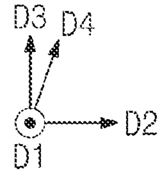
Figure 16:
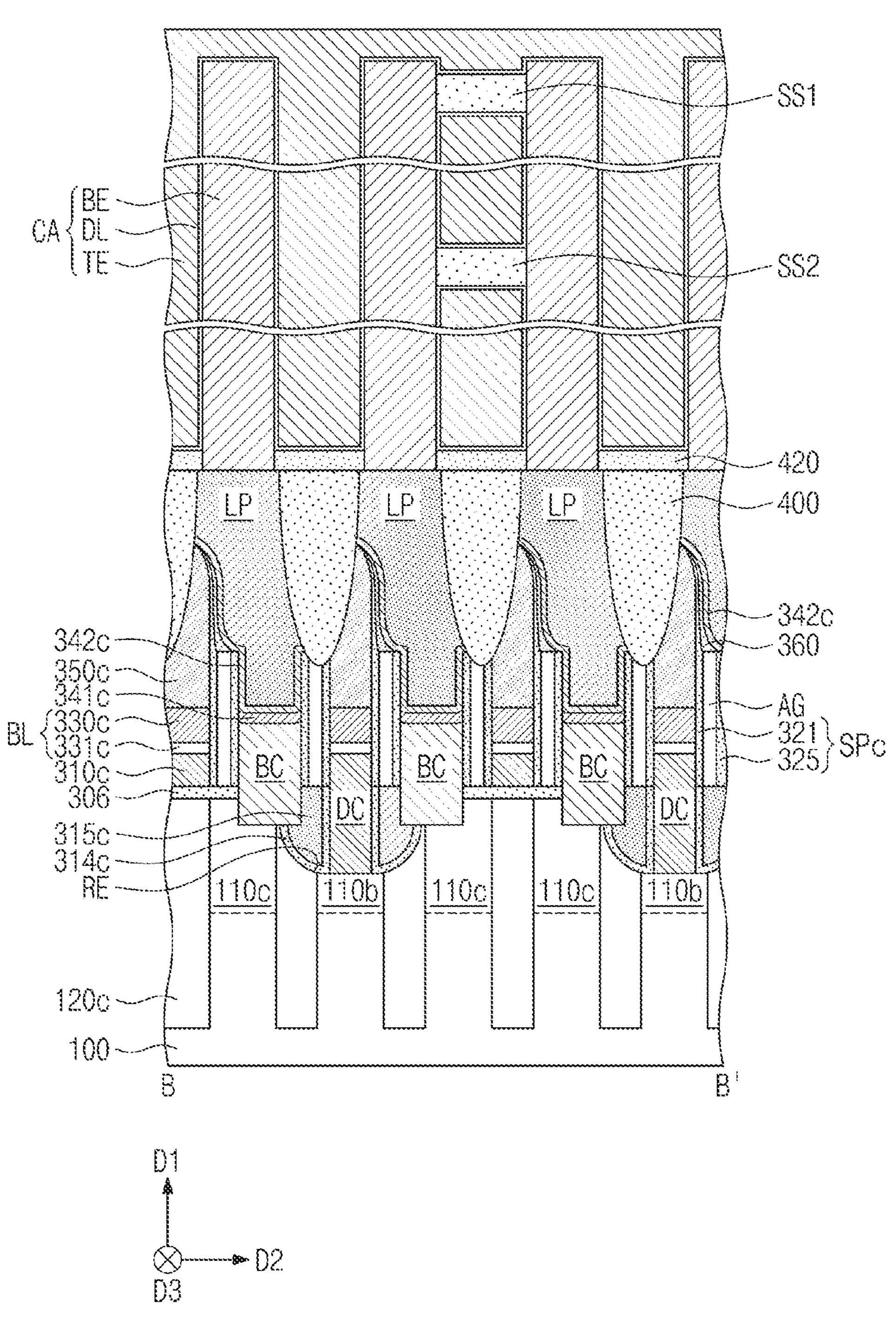
FIG. 16 is a cross-sectional view taken along a line B-B' of FIG. 15 to illustrate a semiconductor device according to some embodiments of the inventive concepts.

FIG. 15 is a plan view illustrating a semiconductor device according to some embodiments of the inventive concepts. FIG. 16 is a cross-sectional view taken along a line B-B' of FIG. 15 to illustrate a semiconductor device according to some embodiments of the inventive concepts.

Referring to FIGS. 15 and 16, a substrate 100 including a cell region CR may be provided. The cell region CR may be a region of the substrate 100, on which the cell blocks CB of FIG. 1 are provided.

Cell active patterns CACT may be disposed on the cell region CR of the substrate 100. The cell active patterns CACT may be spaced apart from each other in the second direction D2 and the third direction D3 when viewed in a plan view. Each of the cell active patterns CACT may have a bar shape extending in a fourth direction D4 which is parallel to the bottom surface of the substrate 100 and intersects the second direction D2 and the third direction D3.

A cell device isolation layer 120*c* may be disposed between the cell active patterns CACT on the cell region CR. The cell device isolation layer 120*c* may be disposed in the substrate 100 to define the cell active patterns CACT.

Word lines WL may intersect the cell active patterns CACT and the cell device isolation layer 120*c* on the cell region CR. The word lines WL may be disposed in grooves formed in the cell active patterns CACT and the cell device isolation layer 120*c*. The word lines WL may extend in the second direction D2 and may be spaced apart from each other in the third direction D3. The word lines WL may be buried in the substrate 100.

First cell dopant regions 110*b* and second cell dopant regions 110*c* may be provided in the cell active patterns CACT. Each of the first cell dopant regions 110*b* may be provided between a pair of the word lines WL intersecting each of the cell active patterns CACT. The second cell dopant regions 110*c* may be provided in both edge regions of each of the cell active patterns CACT. The first cell dopant regions 110*b* and the second cell dopant regions 110*c* may include dopants having the same conductivity type (e.g., an N-type or a P-type).

A buffer pattern 306 may be disposed on the substrate 100 to cover the cell active patterns CACT, the cell device isolation layer 120*c* and the word lines WL. For example, the buffer pattern 306 may include silicon oxide, silicon nitride, and/or silicon oxynitride.

Bit lines BL may be disposed on the buffer pattern 306. The bit lines BL may extend in the third direction D3 and may be spaced apart from each other in the second direction D2. Each of the bit lines BL may include a cell barrier pattern 331*c* and a cell metal-containing pattern 330*c*, which are sequentially stacked. The cell barrier pattern 331*c* and the cell metal-containing pattern 330*c* may include the same materials as the barrier pattern 331 and the metal-containing pattern 330 of FIG. 3, respectively.

Cell poly-silicon patterns 310*c* may be disposed between the bit lines BL and the buffer pattern 306. The cell poly-silicon patterns 310*c* may include the same material as the gate pattern 310 of FIG. 3. A first cell ohmic pattern may be provided between the cell barrier pattern 331*c* and a corresponding cell poly-silicon pattern 310*c*. For example, the first cell ohmic pattern may include a metal silicide.

Bit line contacts DC may be disposed between the bit lines BL and the first cell dopant regions 110*b*, respectively. A bit line contact DC may be provided on a central portion of each of the cell active patterns CACT and connected to a corresponding one of the bit lines BL. The bit lines BL may be electrically connected to the first cell dopant regions 110*b* through the bit line contacts DC. The bit line contacts DC may include dopant-doped poly-silicon or undoped poly-silicon.

Each of the bit line contacts DC may be disposed in a recess region RE. The recess region RE may be provided in an upper portion of the first cell dopant region 110*b* and an upper portion of the cell device isolation layer 120*c* adjacent thereto. A first filling insulation pattern 314*c* and a second filling insulation pattern 315*c* may fill a remaining portion of the recess region RE.

A cell capping pattern 350*c* may extend in the third direction D3 on each of the bit lines BL. For example, the cell capping pattern 350*c* may include silicon nitride.

A bit line spacer SPc may cover a side surface of each of the cell poly-silicon patterns 310*c*, an upper side surface of each of the bit line contacts DC, a side surface of each of the bit lines BL, and a side surface of the cell capping pattern 350*c*. The bit line spacer SPc may extend in the third direction D3 on each of the bit lines BL.

The bit line spacer SPc may include a first sub-spacer 321 and a second sub-spacer 325, which are spaced apart from each other. For example, the first sub-spacer 321 and the second sub-spacer 325 may be spaced apart from each other by an air gap AG, where the first sub-spacer 321 and the second sub-spacer 325 would not be in physical contact. The first sub-spacer 321 may be in contact with the side surface of each of the bit lines BL and may extend onto the side surface of the cell capping pattern 350*c*. The second sub-spacer 325 may be provided along a side surface of the first sub-spacer 321. For example, each of the first and second sub-spacers 321 and 325 may include silicon nitride.

An upper spacer 360 may cover a portion of the side surface of the first sub-spacer 321 and may extend onto a top surface of the second sub-spacer 325. The upper spacer 360 may further cover the air gap AG.

Storage node contacts BC may be disposed between the bit lines BL adjacent to each other. The storage node contacts BC may be spaced apart from each other in the second direction D2 and the third direction D3. A storage node contact BC can be on each of both end portions of each of the cell active patterns CACT. The storage node contacts BC may include dopant-doped poly-silicon or undoped poly-silicon.

A second cell ohmic pattern 341*c* may be disposed on each of the storage node contacts BC. For example, the second cell ohmic pattern 341*c* may include a metal silicide. A cell diffusion barrier pattern 342*c* may conformally cover the second cell ohmic pattern 341*c*, the bit line spacer SPc, and the cell capping pattern 350*c*. The cell diffusion barrier pattern 342*c* may include the same material as the diffusion barrier pattern 342 of FIG. 3. For example, the cell diffusion barrier pattern 342*c* may include a metal nitride (e.g., TiN, TSN, TaN, etc.). The second cell ohmic pattern 341*c* may be disposed between the cell diffusion barrier pattern 342*c* and each of the storage node contacts BC.

Landing pads LP may be disposed on the storage node contacts BC, respectively. The landing pads LP may be spaced apart from each other in the second direction D2 and the third direction D3. The landing pads LP may include a metal (e.g., tungsten).

A filling pattern 400 may surround each of the landing pads LP when viewed in a plan view. The filling pattern 400 may be disposed between the landing pads LP adjacent to each other.

Lower electrodes BE may be disposed on the landing pads LP, respectively. The lower electrodes BE may include at least one of dopant-doped poly-silicon, a metal nitride (e.g., titanium nitride), or a metal (e.g., tungsten, aluminum or copper). Each of the lower electrodes BE may have a circular pillar shape or a hollow cylinder or cup shape. An upper support pattern SS1 may support upper side surfaces of the lower electrodes BE, and a lower support pattern SS2 may support lower side surfaces of the lower electrodes BE. The upper and lower support patterns SS1 and SS2 may include an insulating material such as silicon nitride, silicon oxide, and/or silicon oxynitride.

The etch stop pattern 420 may be provided on the filling pattern 400 between the lower electrodes BE. A dielectric layer DL may cover surfaces of the lower electrodes BE and surfaces of the upper and lower support patterns SS1 and SS2. For example, the dielectric layer DL may include at least one of silicon oxide, silicon nitride, silicon oxynitride, or a high-k dielectric material. An upper electrode TE may be disposed on the dielectric layer DL and may fill a space between the lower electrodes BE. The upper electrode TE may include at least one of dopant-doped poly-silicon, dopant-doped silicon-germanium, a metal nitride (e.g., titanium nitride), or a metal (e.g., tungsten, aluminum or copper). The lower electrodes BE, the dielectric layer DL and the upper electrode TE may constitute capacitors CA, where the upper electrode TE and lower electrodes BE can form the electrodes of the capacitor CA on opposite sides of the dielectric layer DL.

According to the inventive concepts, the semiconductor device may include the gate structure on the substrate and the contact plug laterally spaced apart from the gate structure. The gate structure may include the insulating pattern structure and the metal pattern structure on the insulating pattern structure. The insulating pattern structure may include the recess having the maximum depth in a direction parallel to the top surface of the substrate at the first height. Therefore, a distance from the side surface of the contact plug to the insulating pattern structure may be increased, and thus the influence of the contact plug on the gate structure may be minimized without reducing a total thickness of the gate structure. As a result, the electrical characteristics and reliability of the semiconductor device may be improved.

While the embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:

a substrate including a peripheral active pattern defined by a device isolation layer;

a gate structure on the peripheral active pattern; and a gate spacer covering at least a portion of a side surface of the gate structure, wherein the gate structure comprises an insulating pattern structure and a metal pattern structure on the insulating pattern structure, wherein the insulating pattern structure includes a recess having a maximum depth in a first direction parallel to a top surface of the substrate at a first height, wherein the insulating pattern structure comprises a first gate insulating pattern and a high-k dielectric layer, which are sequentially stacked on the top surface of the substrate, and wherein the gate spacer includes a protrusion in the recess, wherein the first height is higher than a height of an upper surface of the first gate insulating pattern.

2. The semiconductor device of claim 1, wherein the insulating pattern structure further comprises a second gate insulating pattern between the first gate insulating pattern and the high-k dielectric layer, wherein the second gate insulating pattern and the first gate insulating pattern include different insulating materials, and wherein the recess is located between a bottom surface of the second gate insulating pattern and a top surface of the high-k dielectric layer.

3. The semiconductor device of claim 2, further comprising:

a first spacer, a second spacer, and a third spacer, which are sequentially stacked on the gate spacer, wherein the gate spacer and the second spacer include a first material, wherein the first spacer and the third spacer include a second material, and wherein the first material and the second material are different from each other.

4. The semiconductor device of claim 2, wherein the first gate insulating pattern extends in the first direction, and wherein the gate spacer further extends onto a top surface of the first gate insulating pattern.

5. The semiconductor device of claim 2, wherein the first gate insulating pattern includes silicon oxynitride, wherein the second gate insulating pattern includes silicon oxide, and wherein the high-k dielectric layer includes a high-k dielectric material.

6. The semiconductor device of claim 1, wherein the metal pattern structure comprises a first conductive pattern, a gate pattern, a barrier pattern, and a metal-containing pattern, which are sequentially stacked, and wherein the recess extends from a bottom surface of the high-k dielectric layer to a top surface of the first conductive pattern.

7. The semiconductor device of claim 6, wherein the metal pattern structure further comprises a second conductive pattern disposed between the first conductive pattern and the gate pattern, wherein the first conductive pattern includes a metal having a P work function, and wherein the second conductive pattern includes a metal having an N work function.

8. The semiconductor device of claim 1, wherein the insulating pattern structure further comprises a second gate insulating pattern between the first gate insulating pattern and the high-k dielectric layer, and wherein an edge portion of a top surface of the first gate insulating pattern is exposed from the second gate insulating pattern to an outside.

9. The semiconductor device of claim 8, wherein the metal pattern structure comprises a first conductive pattern, a second conductive pattern, a gate pattern, a barrier pattern and a metal-containing pattern, which are sequentially stacked, and wherein the recess extends from a bottom surface of the high-k dielectric layer to a top surface of the second conductive pattern.

10. The semiconductor device of claim 1, wherein the insulating pattern structure further comprises a second gate insulating pattern disposed between the first gate insulating pattern and the high-k dielectric layer, wherein the second gate insulating pattern and the first gate insulating pattern include different insulating materials, wherein the metal pattern structure comprises a first conductive pattern, wherein the first conductive pattern has a P work function, and wherein the recess extends from a bottom surface of the second gate insulating pattern to a top surface of the first conductive pattern.

11. The semiconductor device of claim 1, wherein the recess is located between a bottom surface of the first gate insulating pattern and a bottom surface of the high-k dielectric layer.

12. The semiconductor device of claim 1, wherein the insulating pattern structure further comprises a second gate insulating pattern disposed between the first gate insulating pattern and the high-k dielectric layer, wherein the metal pattern structure comprises a first conductive pattern, a second conductive pattern, a gate pattern, a barrier pattern, and a metal-containing pattern, which are sequentially stacked, wherein the first gate insulating pattern and the second gate insulating pattern include different insulating materials, wherein the first conductive pattern and the second conductive pattern include different metals, wherein a side surface of the gate pattern, a side surface of the barrier pattern, and a side surface of the metal-containing pattern are aligned with each other, and wherein the recess extends from a bottom surface of the first gate insulating pattern to a top surface of the second conductive pattern.

13. A semiconductor device comprising:

a substrate including a peripheral active pattern defined by a device isolation layer;

a gate structure on the peripheral active pattern;

a gate spacer covering at least a portion of a side surface of the gate structure;

a lower insulating pattern provided on the substrate and covering the gate structure and the gate spacer; and a contact plug laterally spaced apart from the gate structure and penetrating the lower insulating pattern so as to be connected to the substrate, wherein the gate structure comprises an insulating pattern structure and a metal pattern structure on the insulating pattern structure, wherein the insulating pattern structure includes a recess having a maximum depth in a first direction parallel to a top surface of the substrate at a first height, wherein a distance from a side surface of the contact plug to a side surface of the metal pattern structure is a first distance, wherein a distance from the side surface of the contact plug to a bottom surface of the recess is a second distance, and wherein the second distance is greater than the first distance.

14. The semiconductor device of claim 13, wherein the second distance is in a range of about 30 nm to about 100 nm.

15. The semiconductor device of claim 13, wherein the insulating pattern structure comprises a first gate insulating pattern and a high-k dielectric layer on the first gate insulating pattern, and wherein the recess is located between a bottom surface of the first gate insulating pattern and a top surface of the high-k dielectric layer.

16. The semiconductor device of claim 13, further comprising:

a diffusion barrier pattern disposed between the lower insulating pattern and the contact plug, wherein the diffusion barrier pattern includes a metal nitride.

17. The semiconductor device of claim 13, further comprising:

a first spacer covering the gate structure and the gate spacer and extending onto the top surface of the substrate; and a second spacer and a third spacer, which are sequentially stacked on the first spacer, wherein the gate spacer and the second spacer include silicon nitride, wherein the first spacer and the third spacer include silicon oxide, and wherein the contact plug further penetrates the first spacer, the second spacer, and the third spacer.

18. The semiconductor device of claim 13, wherein the insulating pattern structure comprises a first gate insulating pattern, a second gate insulating pattern and a high-k dielectric layer, which are sequentially stacked, wherein a distance from the side surface of the contact plug to a side surface of the first gate insulating pattern is a third distance, and wherein the third distance is less than the first distance and the second distance.

19. A semiconductor device comprising:

a substrate including cell active patterns on a cell region and a peripheral active pattern on a peripheral region around the cell region;

word lines provided in the substrate and intersecting the cell active patterns;

bit lines provided on the substrate and intersecting the word lines;

a bit line contact provided on a central portion of each of the cell active patterns and connected to a corresponding one of the bit lines;

a storage node contact on each of both end portions of each of the cell active patterns;

a landing pad on the storage node contact;

a capacitor on the landing pad;

a gate structure on the peripheral active pattern; and a gate spacer covering at least a portion of a side surface of the gate structure, wherein the gate structure comprises an insulating pattern structure and a metal pattern structure on the insulating pattern structure, wherein the insulating pattern structure includes a recess having a maximum depth in a first direction parallel to a top surface of the substrate at a first height, and wherein the gate spacer comprises a protrusion inserted in the recess.

20. The semiconductor device of claim 19, wherein the gate spacer is spaced apart from the substrate.

* * * * *